US007126272B2

(12) United States Patent
Matsumoto

(10) Patent No.: US 7,126,272 B2
(45) Date of Patent: Oct. 24, 2006

(54) ELECTROLUMINESCENCE DISPLAY DEVICE AND PATTERN LAYOUT METHOD FOR THE SAME

(75) Inventor: Shoichiro Matsumoto, Ogaki (JP)

(73) Assignee: Sanyo Electric Co., Ltd.(JP)

( * ) Notice: Subject to any disclaimer, the term of this patent is extended or adjusted under 35 U.S.C. 154(b) by 244 days.

(21) Appl. No.: 10/660,197

(22) Filed: Sep. 11, 2003

(65) Prior Publication Data

US 2004/0051448 A1    Mar. 18, 2004

(30) Foreign Application Priority Data

Sep. 13, 2002  (JP) ............................. 2002-268476
Jan. 27, 2003  (JP) ............................. 2003-017454

(51) Int. Cl.
*H05B 33/00* (2006.01)
(52) U.S. Cl. ...................................... 313/506; 313/501
(58) Field of Classification Search ......... 313/501–512
See application file for complete search history.

(56) References Cited

U.S. PATENT DOCUMENTS 6,690,109 B1 * 2/2004 Tada ........................... 313/504

FOREIGN PATENT DOCUMENTS

EP    1 032 045    8/2000

OTHER PUBLICATIONS

Copy of Notice to Submit Argument for corresponding Korean Patent Application No. 10-2003-62577 with excerpt English translation.
Copy of Japanese Patent Laid-Open Publication No. 2000-235891, its English abstract. and partial English translation.
Copy of Japanese Patent Laid-Open Publication No. 2002-208485, its English abstract, and full English translation.
Complete English translation of Japanese Patent Laid-Open Publication No. 2000-235891.

* cited by examiner

*Primary Examiner*—Joseph Williams
(74) *Attorney, Agent, or Firm*—Cantor Colburn LLP

(57) ABSTRACT

To adjust for differences in service life among light emissive materials used for respective colors by determining the length of a pixel region in the row direction according to the service lives of the light emissive materials. To allow for material change after completion of the laying out process, a light emitting region is formed such that a margin is ensured in the row or column direction within each pixel region.

11 Claims, 16 Drawing Sheets

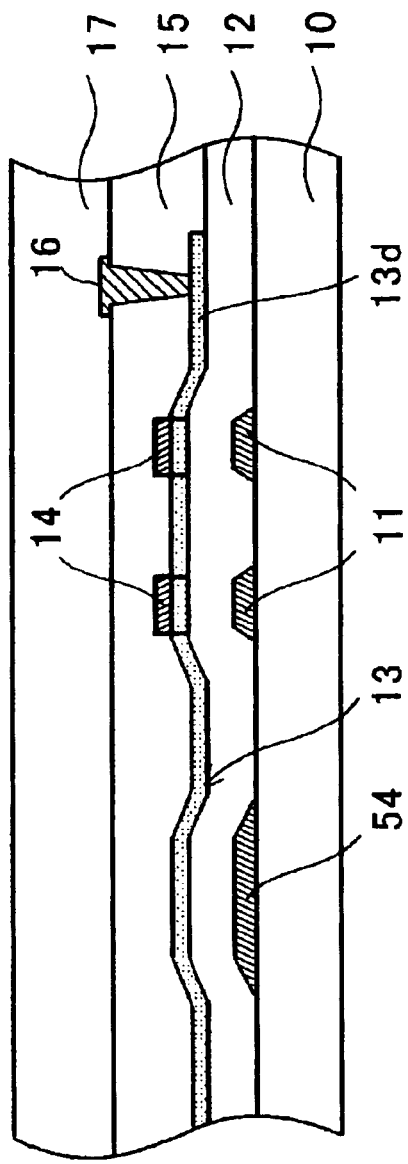
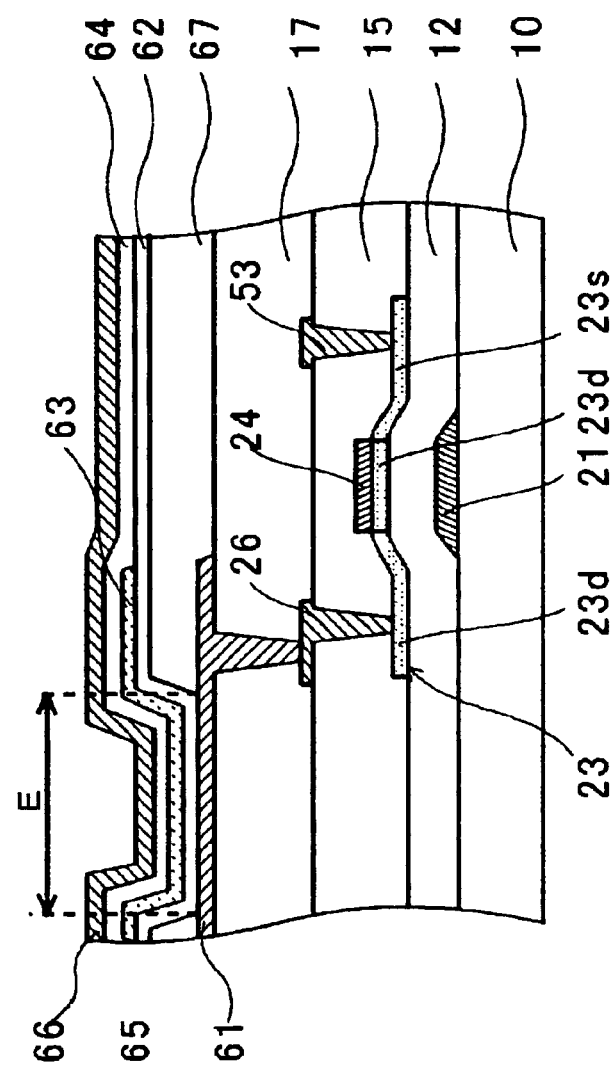
Fig. 4A
Fig. 4B

ELECTROLUMINESCENCE DISPLAY DEVICE AND PATTERN LAYOUT METHOD FOR THE SAME

BACKGROUND OF THE INVENTION

1. Field of the Invention

The present invention relates to a color display device which employs an electroluminescence (hereinafter referred to as EL) self-light emitting element and a thin film transistor (TFT) and further to a method of laying out such a device.

2. Description of the Related Art

In recent years, EL display devices which use EL elements have come to attract a great deal of attention as possible replacements for CRT and LCD display devices. As a means for achieving color display using such EL display devices, a number of methods have been suggested, including an RGB color discriminating method which uses light emissive materials to provide light emission of the three primary colors red, green, and blue, and a method which uses a color filter or a color conversion layer relative to monochrome light emissive materials.

In a color discriminating method, different light emissive materials, each of which is unique in characteristics, such as chromaticity, a service life, light emission efficiency, and so forth, are used for different colors. Generally, in order to maintain appropriate white balance, display devices for color image displaying automatically determine required light emission luminance based on the chromaticity of the light emissive materials used for the respective colors. As the luminance is substantially proportional to the density of a current supplied to the light emissive material, a light emissive material with poor light emission efficiency requires a larger current density in order to obtain the required light emission luminance. However, increased current density places a burden on the material and leads to reduction of the service life of the material and, thus, of the EL display device itself.

FIG. 16 is a plan view schematically showing an organic EL display device disclosed in EP1032045A2, and proposed to address the above problem. In this device, regions each enclosed by a gate signal line 51, a drain signal line 52, and a driving power source line 53 are arranged in a matrix, and light emitting regions R90, G90, and B90 for respective colors, each having a different area depending on a color, are arranged each in each enclosed region. In the drawing, the light emitting regions R90, G90, and B90 each represent a region with visibly recognizable light emission, and letters R, G, and B represent the colors red, green, and blue, respectively.

One key criterion for determining the light emitting area for each different color is the light emission efficiency of the light emissive material used for that color. That is, a light emitting region made of a light emissive material with a relatively poor light emission efficiency is formed having an area larger than that of regions made of other materials in order to obtain the desired light emission luminance.

In this manner, this arrangement can prevent a current of excessive density from being supplied to a light emissive material with poor light emission efficiency, and therefore extend the service life of such a material. However, because an interval of signal lines and of driving lines are determined so as to accommodate the requirement of a color which requires the largest light emitting area, as shown in FIG. 16, pixel spaces are not efficiently utilized in this device, and the device is therefore unsuited for use in a high-density structures.

SUMMARY OF THE INVENTION

According to the present invention, a plurality of pixel regions are respectively correlated to specific color components, and at least a pixel region correlated to one color component among the plurality of color components has an area different from that of a pixel region correlated to another color component. Within each pixel region, a light emitting region is formed. At least a light emitting region correlated to one color component formed within a pixel region is such that its length in the first direction is identical, or equal, to the corresponding length of the associated pixel region and that its length in the second direction which intersects the first direction is shorter than the corresponding length of the associated pixel region. With this arrangement, the space for each pixel is efficiently utilized such that a larger light emitting region can be ensured.

BRIEF DESCRIPTION OF THE DRAWINGS

FIGS. 4A and 4B are cross sectional views of an EL display device in the first embodiment of the present invention;

DESCRIPTION OF THE PREFERRED EMBODIMENTS

Figure 1:
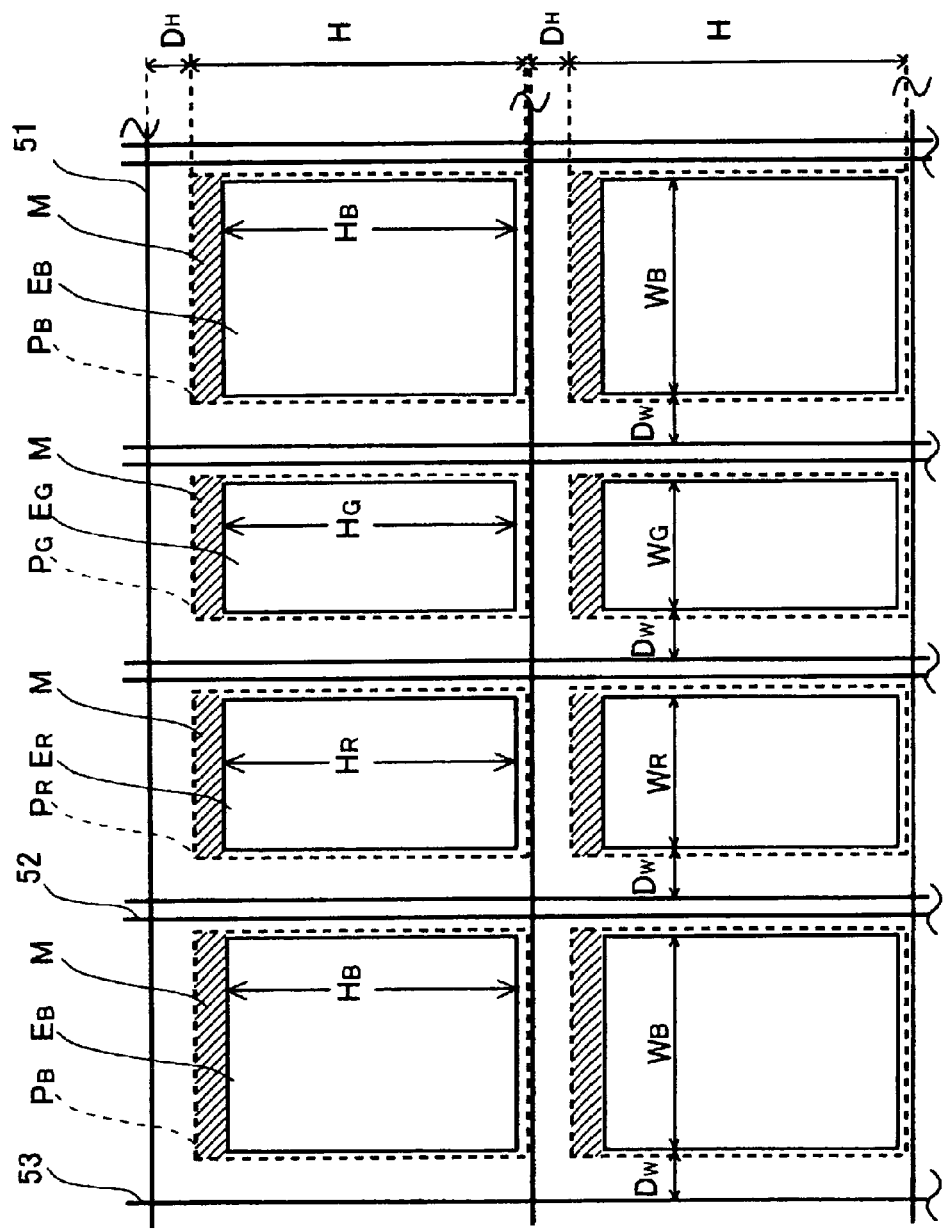
FIG. 1 is a plan view showing light emitting regions of an EL display device in a first embodiment of the present invention.

FIG. 1 is a plan view showing light emitting regions of an EL display device in a first embodiment of the present invention. As shown, light emitting regions are arranged in a stripe in which regions corresponding to the color components of three primary colors (red: R, green: G, and blue: B) are periodically arranged in the row direction, and regions which correspond to a same color component are arranged in columns. Suppose that the service lives of the light emissive materials for the respective color components maintain a relationship G>R>B. Note that "service life" here refers to the period of time before the luminance is reduced to one half of its initial luminance as a result of continuous light emission with a specific current density. Service life is one index of the state of deterioration of light emissive material over time.

The illustrated pixel regions $P_R$, $P_G$, $P_B$ are regions where light emitting regions $E_R$, $E_G$, $E_B$ for visually recognizable light emission of color components can be formed. The pixel regions $P_R$, $P_G$, $P_B$ have heights H (in the vertical direction) which are common among the respective color components and widths $W_R$, $W_G$, $W_B$ (in the horizontal direction) which are unique to the respective color components.

Meanwhile, light emitting regions $E_R$, $E_G$, $E_B$ for emitting light of respective colors have heights $H_R$, $H_G$, $H_B$ (in this case, $H_R$=$H_G$=$H_B$) which are shorter than the height H of the pixel regions $P_R$, $P_G$, $P_B$, and widths $W_R$, $W_G$, $W_B$ which are identical, or equal, to those of their corresponding pixel regions. This arrangement leaves a margin M (the hatched area in the drawing) of the same height along one side of each pixel region $P_R$, $P_G$, $P_B$. Note that a method for determining the heights and widths of a pixel region and a light emitting region, that is, a pattern layout method, will be described later.

Alternatively, the heights $H_R$, $H_G$, $H_B$ of the light emitting regions may be set identical to the height H of the pixel regions, while their widths $W_R'$, $W_G'$, $W_B'$ may be set unique to the respective color components and shorter than the widths W of their corresponding pixel regions. Still alternatively, any combination of the above is applicable.

Along the periphery of the above-structured plurality of pixel regions P, a plurality of gate signal lines 51 are provided in the horizontal direction and a plurality of drain signal lines 52 and a plurality of driving power source lines 53 are provided in the vertical direction. A distance $D_H$ between a gate signal line 51 and a pixel region and a distance $D_W$ between a driving power source line 53 and a pixel region are set respectively constant, regardless of the width $W_R$, $W_G$, $W_B$ of the pixel regions $P_R$, $P_G$, $P_B$ so that a space of an identical shape is left above and left to each pixel region when a gate signal line 51 and a driving power source line 53 are provided along the periphery of the pixel regions P.

A plan structure of the periphery of the pixel region P is described below. The space provided allows common structures and arrangements of the respective structural components, such as a TFT and capacitance elements, which are arranged in the regions enclosed by the signal lines. This can facilitate design of the structure inside the enclosed region.

Moreover, an advantage can be achieved that the structure and layout of such structural elements need not be changed, even when light emissive materials are changed, as described below.

It should be noted that the layout of the periphery of a pixel region is not limited to the above. Specifically, the distances $D_H$ and $D_W$ may be ensured below or right to each pixel region, or in any combination thereof. In the above layout, while no wasteful space is left in each pixel region, a margin is ensured in each pixel region, which is necessary when changing the area of a light emitting region.

Figure 2A:
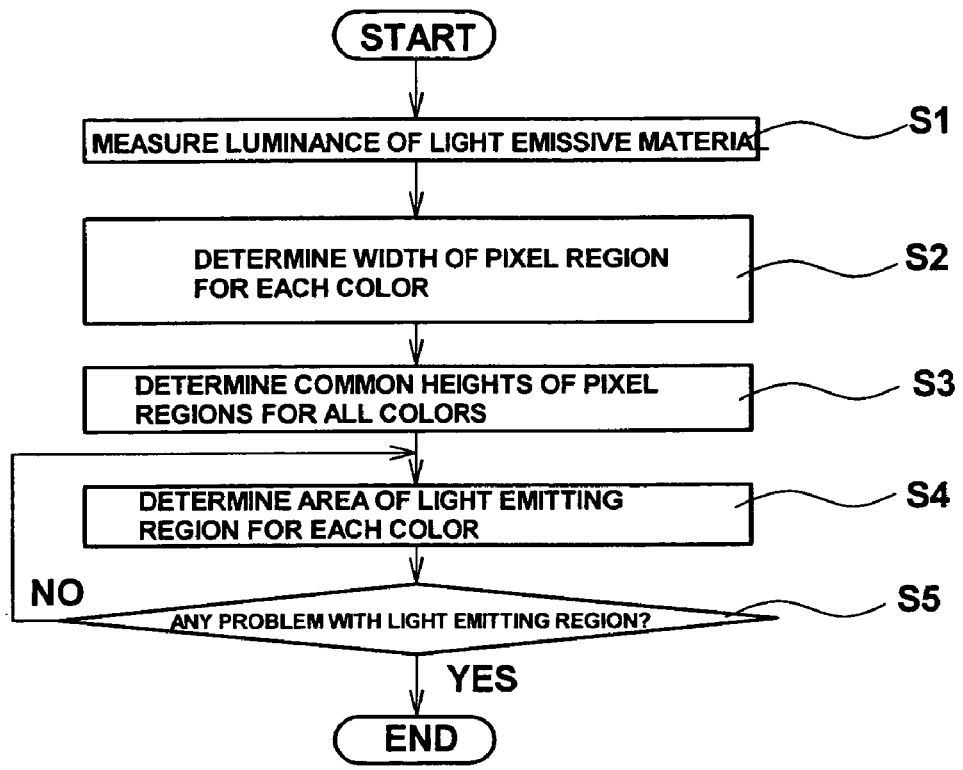
FIGS. 2A and 2B are flowcharts of the process of laying out an EL display device according to the first embodiment of the present invention.

FIG. 2A is a flowchart explaining a pattern layout method which can be used in conjunction with this embodiment. In the following, a method for setting and altering a light emitting region will be described with reference to the flowchart shown in FIG. 2A.

At step S1, the luminance of each light emissive material is measured. Specifically, ideal luminance $L_I$ which would result in appropriate white balance is obtained for each color component based on the chromaticity of a light emissive material used for each color. Then, a current density $I_0$ which makes the period of time before the luminance is halved, that is, the luminance halved period, a target value T is determined for each light emissive material, and light emission luminance $L_0$ with that current density is measured.

At step S2, a ratio between the luminance $L_0$ measured at step S1 and the ideal luminance $L_I$, or $L_I/L_0$ (i.e., luminance ratio), is obtained for each color component. Then, the widths $W_R$, $W_G$, $W_B$ of the pixel regions P correlated to the respective colors are determined in accordance with a ratio among the luminous ratios of the respective colors. For example, assuming that the ratio among the luminous ratios of the respective colors is R:G:B=2:1:3, the widths of the pixel regions for the respective colors are set as $W_R$:$W_G$:$W_B$=2:1:3.

At step S3, the heights H of the pixel regions P are set identical to one another. The identical height H is slightly higher, or longer, than the expected heights $H_R$, $H_G$, $H_B$ of the respective light emitting regions E so that a space for a margin M can be ensured so as to allow for resetting of the heights $H_R$, $H_G$, $H_B$ of light emitting regions E and change of light emissive materials. As a result of the steps S2 and S3, a pixel region P which allows for maximum expansion of a light emitting region E can be ensured.

At step S4, light emitting regions $E_R$, $E_G$, $E_B$ are set. Specifically, the widths of the light emitting regions E are set identical to the widths $W_R$, $W_G$, $W_B$ of their corresponding pixel regions P, and the heights thereof are determined equal to the heights expected at step S3, or $H_R$, $H_G$, $H_B$ ($H_R$=$H_G$=$H_B$). As a result, the light emitting regions $E_R$, $E_G$, $E_B$ are determined with their widths $W_R$, $W_G$, $W_B$ set in accordance with the ratio among the luminance ratios of the respective colors. Therefore, the areas of the light emitting regions $E_R$, $E_G$, $E_B$ are in accordance with the ratio.

At step S5, a trial or simulation or the like is attempted using the values set as above to check if there is any problem with the resultant displaying. For example, whether or not white balance is properly adjusted may be checked. If no problem is found, the laying out process is completed. If a problem is found, the process returns to step S4. For example, when the luminance of blue B is found insufficient, the height $H_B$ of the light emitting region for blue B may be set longer.

As a result of the above, pixel regions and light emitting regions for the respective color components can be set according to the luminance halved periods of the respective light emissive materials.

It should be noted that, although the heights of the light emitting regions for the respective color components are set equal to one another in the above, the application of the present invention is not limited to this arrangement and the heights may be set to different values. In this case, the widths of the respective pixel regions P may be set equal to one another and the heights of the respective light emitting regions E are adjusted depending on color components so that the light emitting areas are in accordance with the ratio of the luminous ratios of the respective colors.

Figure 2B:
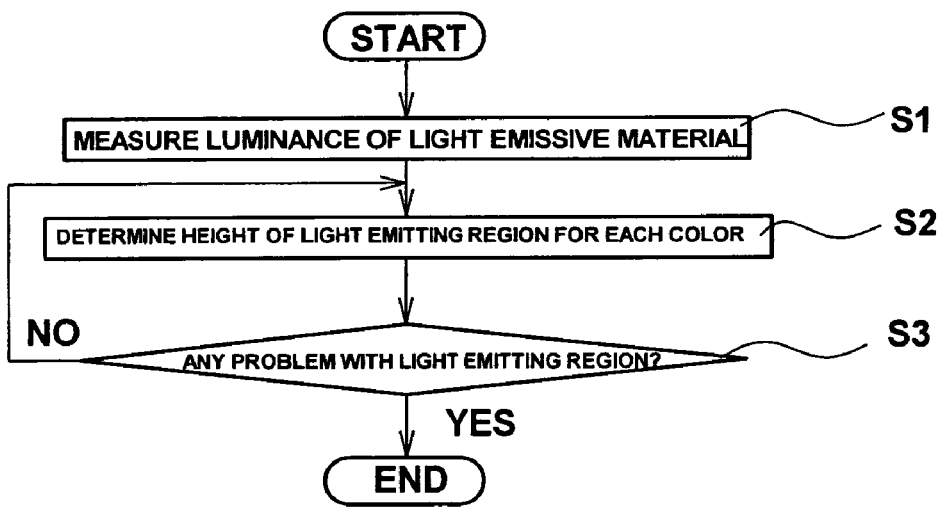

FIG. 2B is a flowchart illustrating a process of alteration of the light emitting regions. Such alteration may become necessary when, for example, an improved material is used, or for any other reason. The following example will discuss a current density for a material for blue B which can attain a luminance halved period T is changed from current density $I_0$ to $I_t(>I_0)$ under the same condition as a result of improvement of the material.

At step S1, the luminance of the newly employed material is measured. Then, current density $I_t$ which can attain a luminance halved period T of the newly employed light emissive material is determined and light emission luminance L1 with that current density I1 is measured.

At step S2, the height of the light emitting region correlated to blue B is determined. Specifically, the height of the light emitting region E correlated to each color component is altered according to the rate of change $X$ ($=L_1/L_0$) from the luminance $L_0$ with current density $I_0$ before the change to the luminance $L_1$, measure at step S1, with current density $I_1$, after the change.

Methods for altering the height of a light emitting region can be broadly divided into three types, as described below.

According to a first type, the heights of the light emitting regions of color components without change, namely, red R and green G here, are made higher than before the change according to the change rate X ($H_R \rightarrow H_R'$, $H_G \rightarrow H_G'$, $X H_R'$ $H_R = H_G' H_G$) whereby the respective colors are balanced.

In this embodiment, because a margin M is ensured within each pixel region during initial setting of a pixel region and a light emitting region, it is possible to expand the light emitting region while utilizing the margin M to thereby increase the luminance of each color and thus of the entire luminance.

According to a second type, the height of the light emitting region correlated to a color component with the material change, namely, blue B here, is made lower than before the change according to the change rate X ($H_B \rightarrow H_B'$, $X = H_B/H_B'$) whereby the respective colors are balanced. Such a method is effective when at least one of the light emitting regions without material change, namely, red R and green G here, is already as high as that of the pixel region after repetitive alterations of the height, thus allowing no more increase of its height.

A third type is a combination of methods of the first and second type. Such a method can allow wide freedom in alteration, and great flexibility.

It should be noted here that, although change of the luminance which attains a luminance halved period T, as a result of material change, is the sole concern in the above, in actual practice material change often causes chromaticity change, which in turn causes change of ideal luminance of each color component which attains suitable white balance.

Therefore, a luminance ratio of each color component is recalculated and a ratio among luminous ratios of the respective colors is obtained. Then, the heights of the respective light emitting regions are reset such that the respective light emitting areas are in accordance with the ratio among luminous ratios of the respective colors. In this case, the third method described above is effective and practicable.

At step S3, similar to step S5 in FIG. 2A, whether or not there can be found any problem with the values set as above is determined. Specifically, a trial or simulation or the like is attempted using the values set at step S2 to check if there is any problem with the resultant displaying device. When no problem is found, the laying-out process is completed. If a problem is found, the process returns to step S2.

According to the method described above, change of light emitting characteristics due to material change can be accommodated by altering only the height of a light emitting region E, and no other alteration in layouts is necessary. Therefore, the number of masks used in manufacturing and needed to be changed can be minimized. Specifically, only a single mask, that which is used to define a light emitting region, must be changed.

In addition, even when the height of a light emitting region E correlated to one of the color components is already as high as the height H of the pixel region P, change of light emitting characteristics due to material change can be accommodated by adjusting the height of a light emitting region correlated to another color component. In this case, the light emitting region having a height H of the pixel region is preferably for the color component which requires the largest light emitting area.

It should be noted that, although change of a light emissive material for blue B is described in the above, change of materials for green G and red R can be similarly handled. Moreover, change of materials for two or more color components can also be coped with.

Further, although a margin M is provided above a light emitting region in this embodiment, a margin M may be provided below or right or left to a light emitting region E so that the material change can be similarly accommodated. When a margin M is provided to the right or left of a light emitting region E, the width of the light emitting region E may be altered to thereby accommodate the material change. In such a case, the height is kept fixed, while the width of the light emitting region E is altered.

It should be noted that processing of FIGS. 2A and 2B may be preferably conducted using a computer. Specifically, a program necessary for the processing is stored in advance in a computer, together with data on ideal light emission luminance, a basic pixel region size, a margin M value, and so forth, and data on a measured luminance as for each light emissive material is input to the computer. The computer then executes the processing at S2 to S4 to determine, and output, the size to which to alter the pixel region and the light emitting region. Then, a trail is attempted using the thus determined value to see if there is any problem. If any problem should be found, data on the problem may be input to the computer, which then calculates a corrected value.

It should be noted that, when it is arranged such that simulation, evaluation of the simulation, and correction based on a simulated result are all performed by a computer, appropriate laying out of a pixel region and a light emitting region can be automatically performed in response to an input of a measured luminance of a light emissive material. Also note that, when a necessary program is stored in the computer in advance, a computer can conduct processing of FIG. 2B in response to an input of a measured result.

Figure 3:
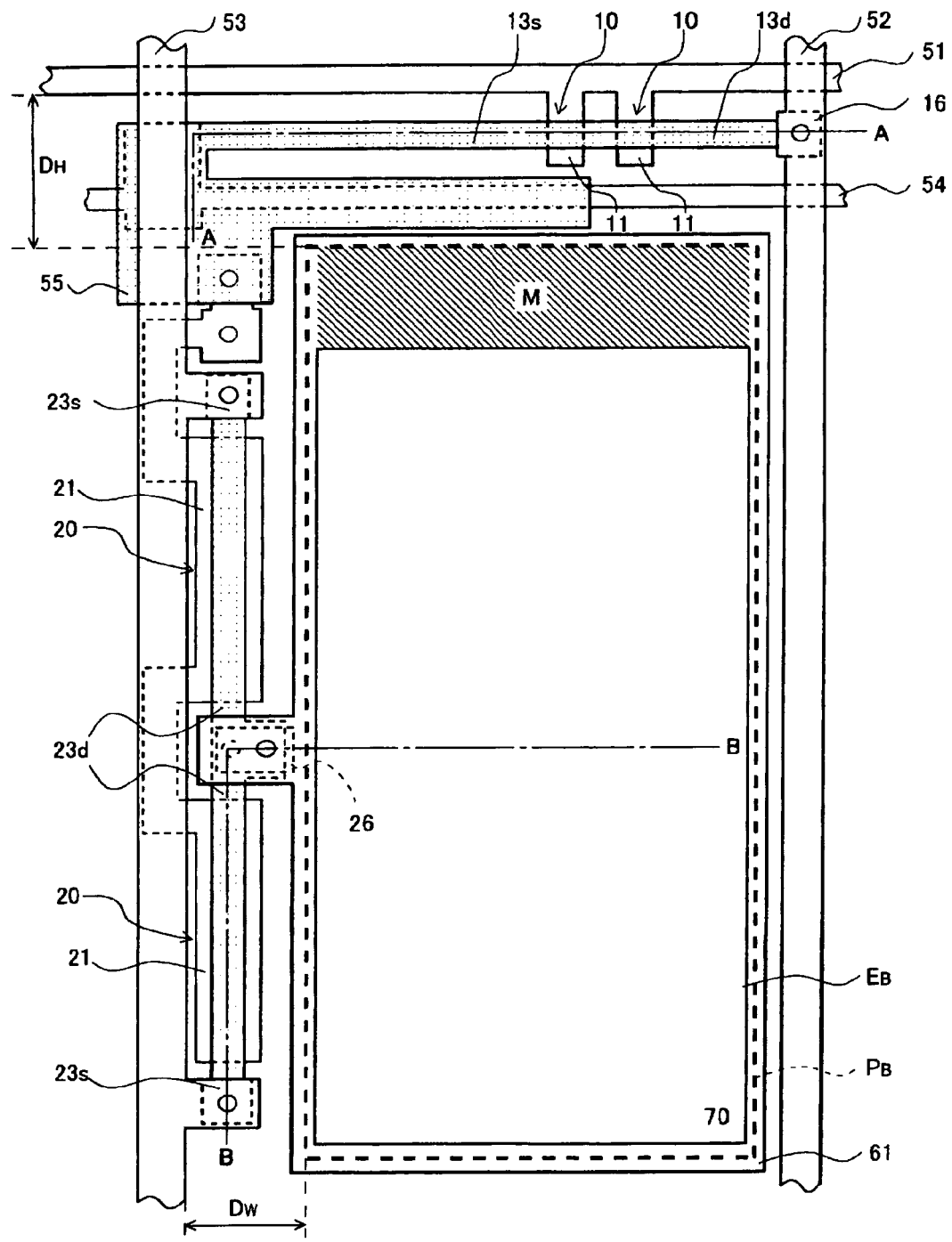
FIG. 3 is a plan view showing the periphery of a pixel region of an EL display device in the first embodiment of the present invention.

FIG. 3 is a plan view showing a structure of the periphery of a pixel region $P_B$ in this embodiment. FIGS. 4A and 4B are cross sectional views along the segments A—A and B—B, respectively, in FIG. 3. In the following, the structure of a pixel region P and its periphery in this embodiment will be described with reference to FIG. 3.

A light emitting region $E_B$ is provided within a pixel region $P_B$, leaving a margin M in an upper (in view of the drawing) portion within the pixel region $P_B$. Two serially connected first TFTs 10, a holding capacitance electrode line 54, and a part of a capacitance electrode 55 are provided in a space between the pixel region $P_B$ and the gate signal line 51. The gates 11 of the two TFTs 10 are connected to the gate signal line 51. The drain 13d of the TFTs 10, located closer to a drain signal line 52, is connected to the drain signal line 52, while the source 13s thereof is connected to a capacitance electrode 55, which forms a capacitance between itself and the holding capacitance electrode line 54. The source 13s of the TFTs 10 is further connected to the gate electrode 21 of two parallel connected second TFTs 20. The sources 23s of the two TFTs 20 are connected to a driving power source line 53, while the drains 23d thereof are connected to a drain electrode 26 and further to the anode 61 of the organic EL element 70 via the drain electrode 26.

The holding capacitance electrode line 54 opposes, via the gate insulating film 12, the capacitance electrode 55, which is connected to the source 13s of the TFT 10, so that electric charges are accumulated between the holding capacitance electrode line 54 and the capacitance electrode 55 thereby forming a capacitance. The capacitance serves as a holding capacitance for holding a voltage to be applied to the gate electrode 21 of the TFT 20. It should be noted that the source 13s, the channel 13c, and the drain 13d of the TFTs 10 and the capacitance electrode 55 are a part of a poly-silicon active layer 13 and are doped with impurities throughout, except for the channel 13c.

It should also be noted that, although the pixel region $P_B$ and the light emitting region $E_B$ are shown rectangular in FIG. 3, these may have a different shape in order to ensure a larger light emitting area or due to restriction in layout. "Rectangular" in this specification refers to not only shapes which are strict rectangles, but also to shapes which can roughly be considered as rectangular. It should also be noted that the location of a margin M is not limited to that shown in this embodiment, though provision of a margin M closer to one side than other sides of a pixel region is preferred. The structure described above in connection with a pixel region $P_B$ and its periphery is substantially common to pixel regions $P_G$ and $P_R$ and their peripheries.

In the following, a structure of a TFT 10 will be described with reference to FIG. 4A. The TFT 10 is a bottom-gate TFT for switching. Specifically, on a substrate 10, a gate electrode 11 and a holding capacitance electrode line 54 are formed, both made of metal, such as chrome (Cr) or molybdenum (Mo), having a high melting point. Further, a gate insulating film 12 and an active layer 13 made of a polycrystalline silicon (hereinafter abbreviated as p-Si) are formed in that order. On the positions corresponding to the gates 11, stoppers 14 are formed on the active layer 13, and serve as a mask in ion implantation to the active layer 13. In the active layer 13, a drain 13d, a source 13s, and a channel 13c are formed, in which the channel 13c is located between the other two. With the above, a first TFT 10 and a holding capacitance are constituted.

Further, covering the entire surface of the gate insulating film 12, the active layer 13, and the stopper 14, an interlayer insulating film 15 made of an $SiO_2$ film, an SiN film, or the like, is formed. On a position corresponding to the drain 13d, a contact hole is formed piercing through the interlayer insulating film 15. A drain electrode 16 made of metal such as Al is formed in the contact hole. A planarization film 17 made of organic resin is formed covering the entire surface of the substrate to provide a flat surface.

Next, a structure of a TFT 20 will be described with reference to FIG. 4B. The TFT 20 is a bottom-gate TFT for driving an organic EL element. On a substrate 10, a gate electrode 21 made of metal, such as Cr, Mo, or the like, having a high melting point, a gate insulating film 12, and an active layer 23 made of a p-Si film are sequentially formed. On the positions corresponding to the gate electrode 21, a stopper 24 is formed on the active layer 23, which serves as a mask in ion implantation to the active layer 23. In the active layer 23, a drain 23d, a source 23s, and a channel 23c are formed, in which the channel 23c is located between the other two. A second TFT is thereby constituted.

Covering the entire surface of the gate insulating film 12 and the active layer 23, an interlayer insulating film 15 made of an $SiO_2$ film, an SiN film, or the like, is formed. On positions corresponding to the drain 23d and the source 23s, contact holes are formed piercing through the interlayer insulating film 15. A metal drain electrode 26 and a driving power source line 53 connected to a driving power source are formed in the respective contact holes. A planarization film 17 made of organic resin is formed covering the entire surface of the substrate to provide a flat surface. An anode 61, made of ITO (Indium Tin Oxide), is formed on and in, or piercing through, the planarization film 17 to be connected to the drain electrode 26. A light emitting element layer 65, which comprises three layers including a hole transfer layer 62, a light emitting layer 63, and an electron transfer layer 64, is formed on the anode 61. A cathode 66 made of aluminum alloy or the like is formed covering the light emitting element layer 65.

In the above structure, a second planarization film 67 made of electric insulating resin is formed between the hole transfer layer 62 and the anode 61. The second planarization film 67 has an opening in a region corresponding to the anode 61, and the opening defines a region through which the anode 61 is exposed. That is, a light emitting region E is defined by the opening of the second planarization film 67. In this case, a pixel region P is defined by the anode 61.

In addition to the method described above, or a method of the first type which utilizes the second planarization film 67 in formation of a light emitting region E having a predetermined shape, a second methodology may be employed.

Figure 5A:
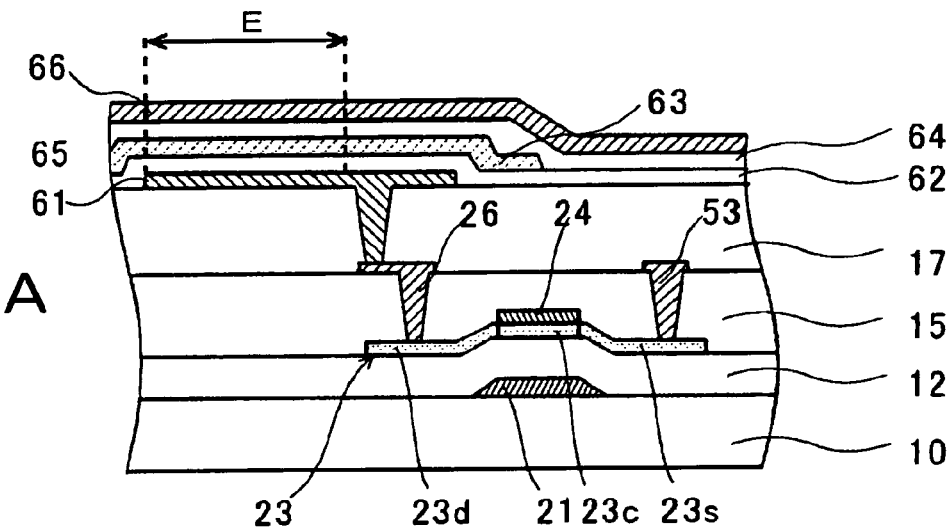
FIGS. 5A and 5B are cross sectional views of a second TFT of an EL display device in the first embodiment of the present invention.

As shown in FIG. 5A, the second method utilizes the shape of the anode 61, rather than the second planarization film 67. In this method, as light is emitted from the entire surface of the anode 61, a light emitting region E is defined by the anode 61. In this method, a pixel region P is defined by the light emitting layer 63. It should be noted that a projected portion of the anode 61 for connection to the drain 23d of the second TFT 20 is excluded from the light emitting region E.

Figure 5B:
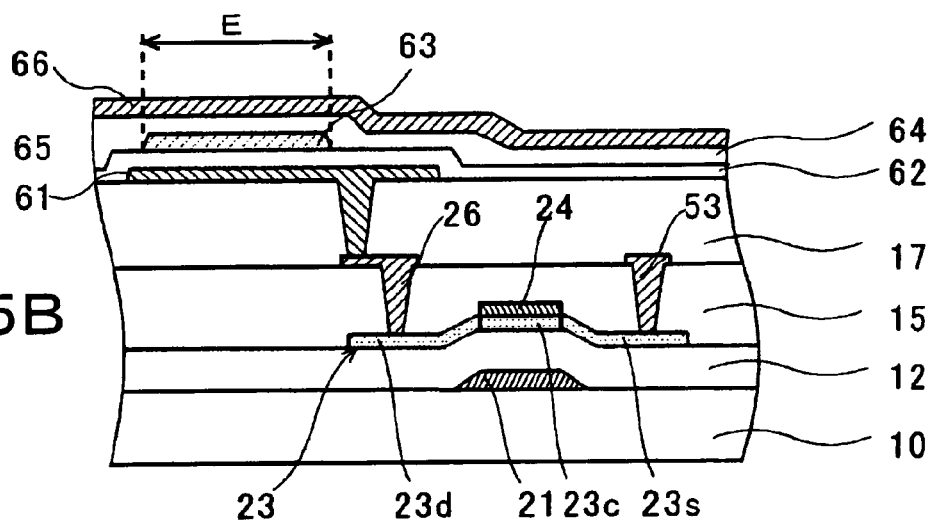

Besides the above two method types, a third method type which utilizes the light emitting layer 63, as shown in FIG. 5B, rather than the second planarizatino film 67, may be employed. In such a method, as light is emitted from the entire surface of the light emitting layer 63, a light emitting region E is defined by the light emitting layer 63. A pixel region P is defined by the anode 61.

FIGS. 6A to 6D are cross sectional views explaining respective stages in the manufacturing of an EL display device according to this embodiment. These views correspond to a cross sectional view along the segment B—B in FIG. 3. In the following, manufacturing of an EL display device using the first method will be described.

Figure 6A:
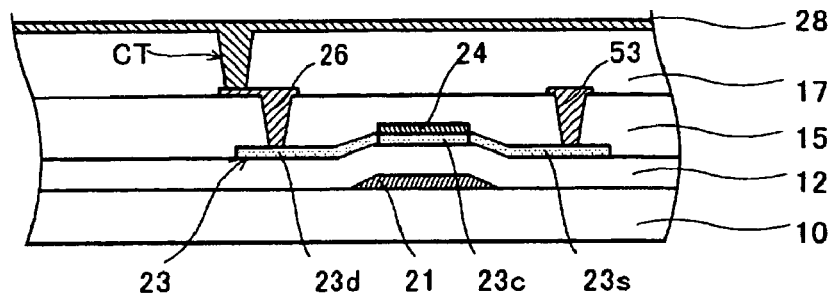
FIGS. 6A, 6B, 6C and 6D are cross sectional views showing respective stages in manufacturing of an EL display device in the first embodiment of the present invention.

FIG. 6A is a cross sectional view showing a first manufacturing stage. At this stage, after formation of the second TFT 20 using a conventional method, an interlayer insulating film 15 is formed so as to cover the TFT 20. Then, the driving power source line 53 connected to the source 23s of the TFT 20 and the drain electrode 26 connected to the drain 23d of the TFT 20 are formed, and the planarization film 17 is further formed over them. A contact hole CT is formed which pierces through the planarization film 17 and reaches the drain electrode 26. An ITO 28, or a transparent anode material, is sputtered on the entire surface of the planarization film 17 and in the contact hole CT.

Figure 6B:
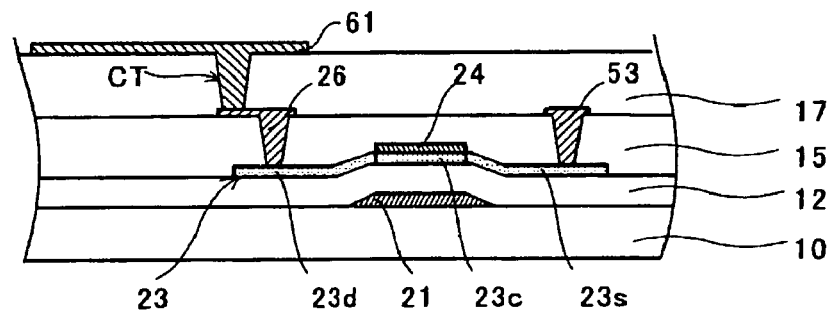

FIG. 6B is a cross sectional view showing a second manufacturing stage. At this stage, resist is formed on the ITO 28. Thereafter, the resist is exposed to light using a mask and then developed for patterning. Then, using the resist as a mask, the ITO 28 is etched to thereby form an anode 61.

Figure 6C:
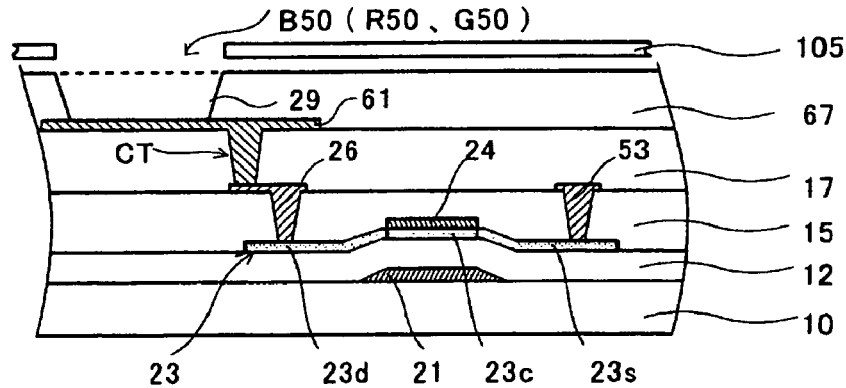
Figure 7:
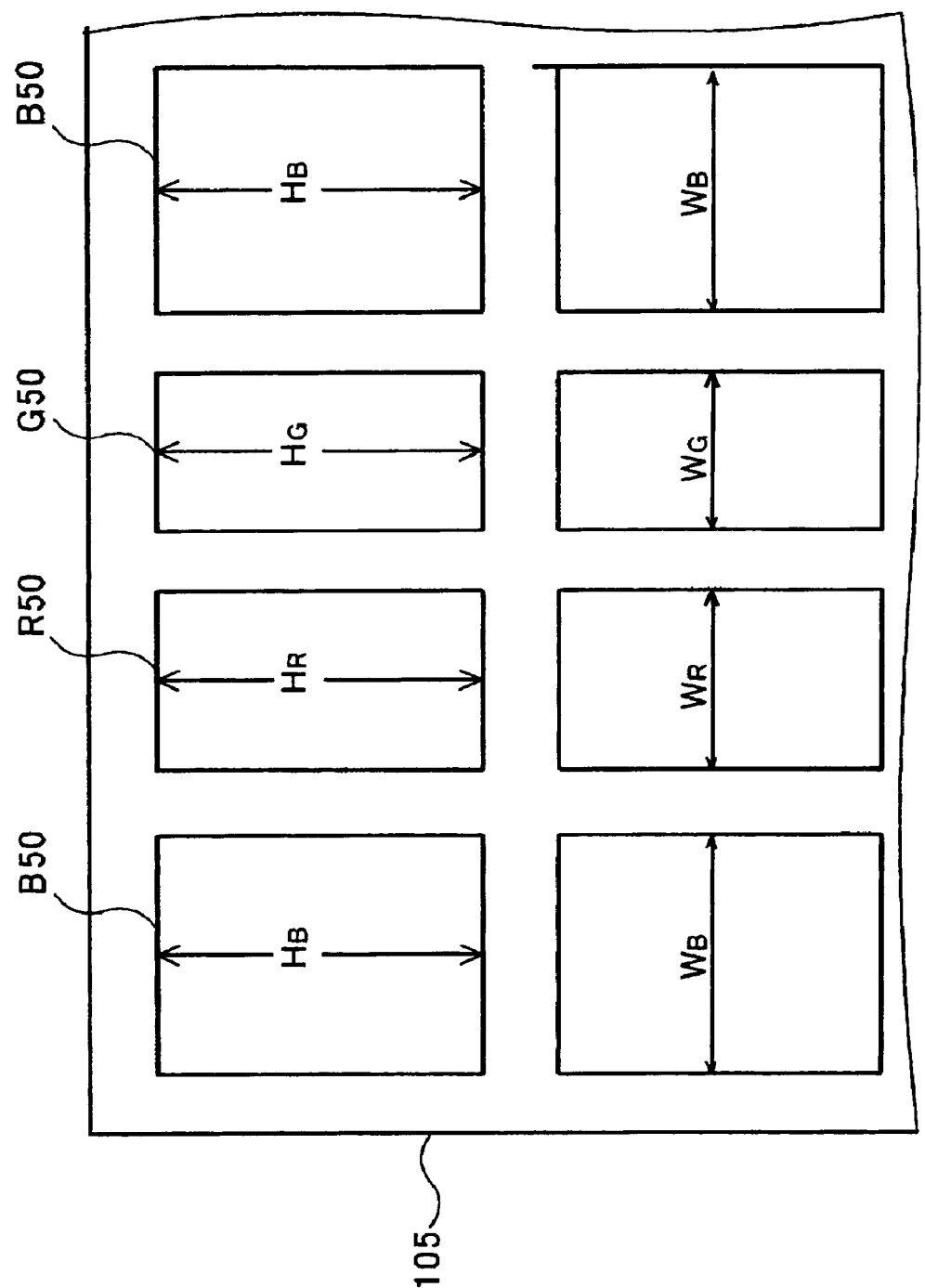
FIG. 7 shows a mask for use in formation of an anode of an EL display device in the first embodiment of the present invention.

FIG. 6C is a cross sectional view at a third stage of the manufacturing process. At this stage, second planarization film material which is organic resin is formed by spin-coating or the like on the anode 61 and the planarization film 17. The second planarization film material is then exposed using a mask 105 and developed to thereby form a second planarization film 67. Here, the mask 105 has a plurality of openings R50, G50, and B50, as shown in FIG. 7, for example, and the openings R50, G50, and B50, each for defining a light emitting region, have predetermined widths $W_R$, $W_G$, $W_B$ and heights $H_R$, $H_G$, $H_B$, respectively. Therefore, the resultant second planarization film 67 has an opening having a shape identical to that of a light emitting region E and formed in a position corresponding to the light emitting region E. The anode 61 is exposed through the opening.

Figure 6D:
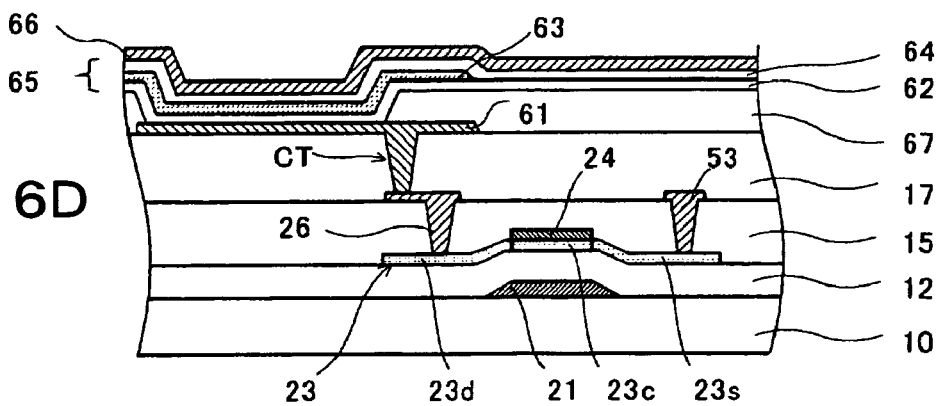

FIG. 6D is a cross sectional view showing a fourth stage of the manufacturing process. At this stage, a hole transfer layer 62 is formed through evaporation on the second planarization film 67 so as to cover the entire substrate including the exposed anode 61. A light emitting layer 63 is formed through evaporation using a different mask for a different kind of light emissive material. An electron transfer layer 64 is formed through evaporation on the entire surface of the substrate. The hold transfer layer 62, the light emitting layer 63, and the electron transfer 64 together constitute a light emitting element layer 65. A cathode 66 is formed through evaporation using a mask over the light emitting element layer 65.

It should be noted that, because the resistance of these light emissive materials is relatively high, the light emitting element layer 65 between the anode and the cathode serves as a light emitting region. Although the hole transfer layer 62 and the electron transfer layer 64 are formed over the entire surface of the substrate in the above, a different transport layer material may be used for a different kind of light emissive material.

Through the above process, a color display device employing an organic EL element having a desired light emitting region for each color is constituted.

Next, a second method for defining a light emitting region E having a predetermined shape will be described, in which an anode 61 is utilized to define a light emitting region E. This method is achievable through substantially identical processing stages to those for the first method, except that the second planarization film 67 is not formed. Instead, an anode 61 having an identical shape to that of a light emitting region is formed using a mask in a region where the light emitting region is to be formed, and a light emitting element layer 65 and a cathode 66 are formed so as to cover the anode 61. This method results in an EL display device having a cross sectional structure as shown in FIG. 5A. Note that a mask for use in formation of the anode 61 may have openings, similar to the mask of FIG. 7, each having a shape identical to that of a light emitting region E and formed in a position corresponding to a light emitting region E.

A third method for defining a light emitting region E having a predetermined shape will be described, in which a light emitting layer 63 is utilized to define a light emitting region E. This method is achievable through substantially identical processing stages to those for the second method, except that a larger anode 61 than a light emitting region is formed and a light emitting layer 63 having an identical shape to that of a light emitting region E is formed using a mask in a region where the light emitting region E is to be formed. This method results in an EL display device having a cross sectional structure as is shown in FIG. 5B. Note that a mask for use in formation of the light emitting layer 63 may have openings, similar to the mask of FIG. 7, each having a shape identical to that of a light emitting region E and formed in a position corresponding to a light emitting region E. For this method, the same number of masks as the number of different light emissive materials are necessary because a different kind of light emissive material is used for a different color component. Each mask has an opening corresponding to a light emitting region E correlated to one color component. As described above, in conjunction with the present embodiment, because a light emitting region E is provided together with a margin M within a light emitting region, the height of the light emitting region E having already been laid out can be altered within the range of the pixel region while maintaining its width not altered. This makes it possible to maintain a constant white balance even when the materials are changed.

Moreover, in the above, because it is unnecessary to change the size or layout of the region enclosed by the gate signal line 51, the drain signal line 52, and the driving power source line 53, only the minimum number of masks, which may be one, must be changed. For example, for an EL display device having a second planarization film 67, it is only the height of the opening formed on a mask which is used to form the second planarization film 67 that must be altered to thereby alter the height of the light emitting region, in order to accommodate the material change. That is, material change can be accommodated by changing only the one mask used to form the second planarization film 67.

It should be noted that because the anode 61 is smaller than a pixel region P, though larger than a light emitting region E, the pixel region P may not be defined by the anode 61. Therefore, should the height of the light emitting region E be altered to become higher than that of the anode 61, a mask used to form the anode 61 must be changed in addition to changing a mask used to form the second planarization film 67. That is, two masks must be changed in such a case.

Figure 8:
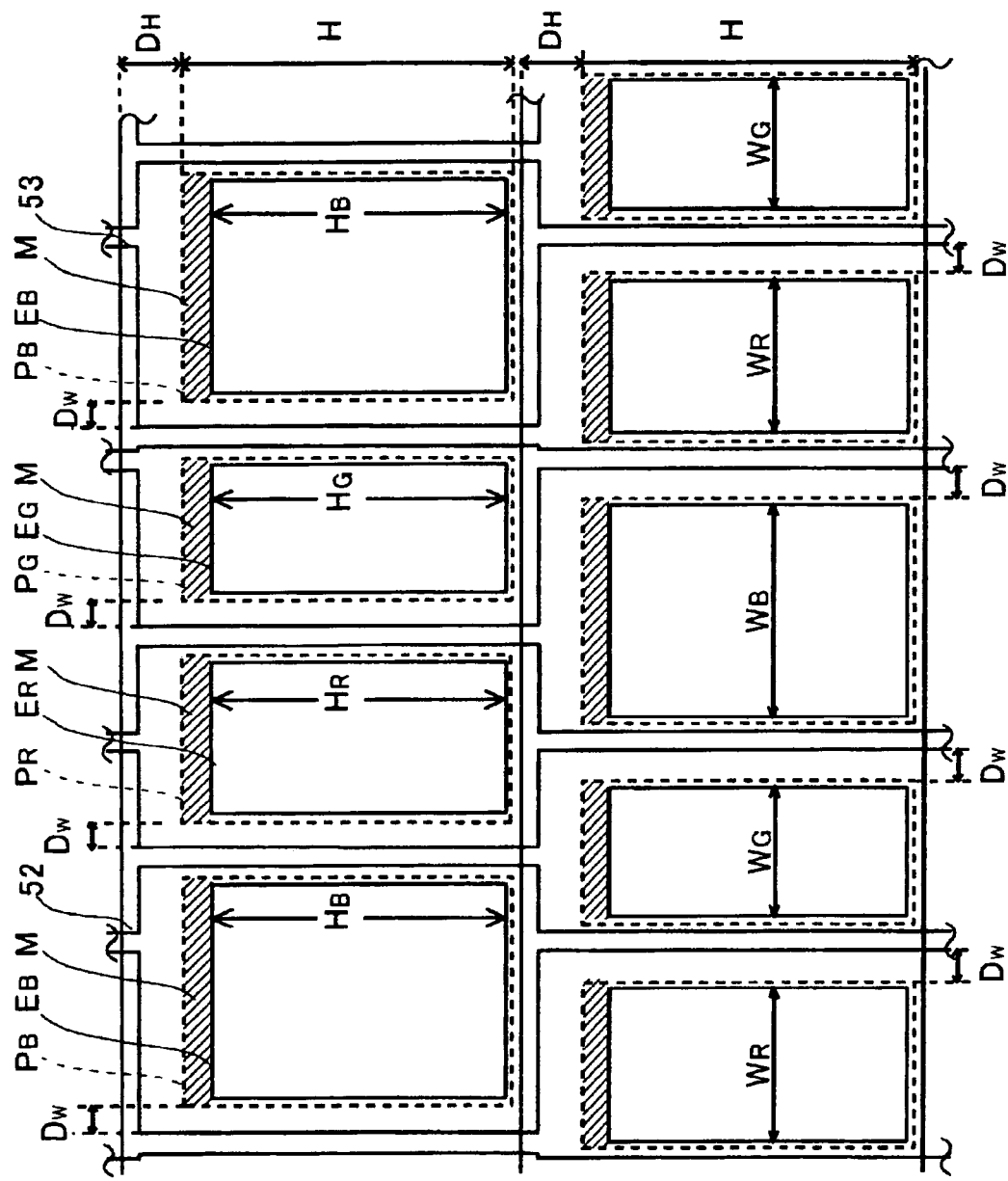
FIG. 8 is a plan view showing a light emitting region of an EL display device in a second embodiment of the present invention.

FIG. 8 is a plan view showing a light emitting region of an EL display device according to a second embodiment of the present invention. In the drawing, pixel regions $P_R$, $P_G$, $P_B$ and light emitting regions $E_R$, $E_G$, $E_B$, each determined as in the first embodiment, are arranged with displacement by about 1.5 pixel region between an odd-numbered row and an even-numbered row. With such an arrangement, any combination of three adjacent pixel regions include red R, green G, and blue B. This arrangement is referred to as a delta alignment.

Similar to the first embodiment, a plurality of gate signal lines 51 are horizontally provided so as to enclose the pixel regions P and the light emitting regions E. Moreover, a plurality of drain signal lines 52 and a plurality of driving power source lines 53 are arranged vertically and horizontally (in the drawing). The gate signal lines 51 and the drain signal lines 52 or the driving power source lines 53 intersect each other.

It should be noted that, in a delta alignment such as that described in this embodiment, due to restriction in a pattern layout, the widths of pixel regions correlated to the same color in adjacent rows may slightly differ from each other. This can be addressed by adjusting the height or width of the light emitting regions such that these regions have the same area. It should also be noted that, change of light emissive materials can be accommodated by altering only a light emitting region, and therefore it is only necessary to change the minimum number of masks, which may be as few as one.

It should further be noted that the present invention is not limited to the above arrangement, and light emitting regions may be arranged diagonally, rather than in stripe or delta. Further, the shape of a light emitting region is not limited to a rectangular shape, and may be parallelogram or an L-shape. For an L-shaped region, in particular, a rectangular region may be extracted from the L-shaped region and adjusted, while considering the height of the extracted rectangular region as the height $H_R$, $H_G$, $H_B$ of a light emitting region, according to a ratio among the luminous ratios of the respective color components whereby the light emitting region is set or re-laid out. A TFT in a light emitting region may be formed using a conventional method and material. The type of a TFT is not limited to a bottom-gate type, but may be a top-gate type which has a gate electrode above an active layer.

Although setting and changing of the area of a light emitting region based on a luminance halved period is described in the above, the setting or changing may be made based on any other characteristics which are unique to a light emissive material or those which vary over time, such as light emission efficiency. In this case, a service life should be replaced by light emission efficiency or the like in interpretation.

Although an EL display device of a bottom-emission type in which light from a light emitting layer passes through a TFT substrate to be output from its rear side is described in this embodiment, a top-emission type in which light from a light emitting layer is output from the front side of a TFT substrate may also be applicable to an EL display device of the present invention.

As described above, in this embodiment, light emitting regions can be laid-out without leaving any wasteful space and, therefore, a larger light emitting region can be ensured. In addition, because service lives of the respective light emissive materials can be set substantially identical, the resulting EL display device can retain high quality and properly adjusted white balance even after a long period of time of using.

In addition, because a light emitting region is provided within a pixel region, variation of characteristics, such as a service life or light emission efficiency, of a light emissive material over the elapse of time or due to change of the light emissive materials can be accommodated by altering or modifying the light emitting region within the pixel region. That is, alteration of layout of regions other than a light emitting regions, such as a TFT and a holding capacitance, is unnecessary. Therefore, a period of time required to re-layout or to manufacture an EL display device can be reduced.

Further, although change of a plan layout of an EL display device generally necessitates change of a layout or manufacturing of each layer which constitutes a structural element of an EL display device, according to the present invention, it is sufficient to alter only a light emitting region. Therefore, a period of time required to change a layout or to manufacture each layer can be reduced, which leads to reduction of relevant layout or manufacturing costs. Moreover, because it is sufficient to change only structural element or elements of an EL element of a light emitting region, which is/are needed to be changed among those including an anode, a planarization film above the anode, and a light emitting layer, only a mask or masks used to form such an element or elements must be changed. Therefore, it is sufficient to change only a minimum number of masks, which may be as few as one. This enables significant reduction of costs involved with creating or repairing masks.

Figure 9:
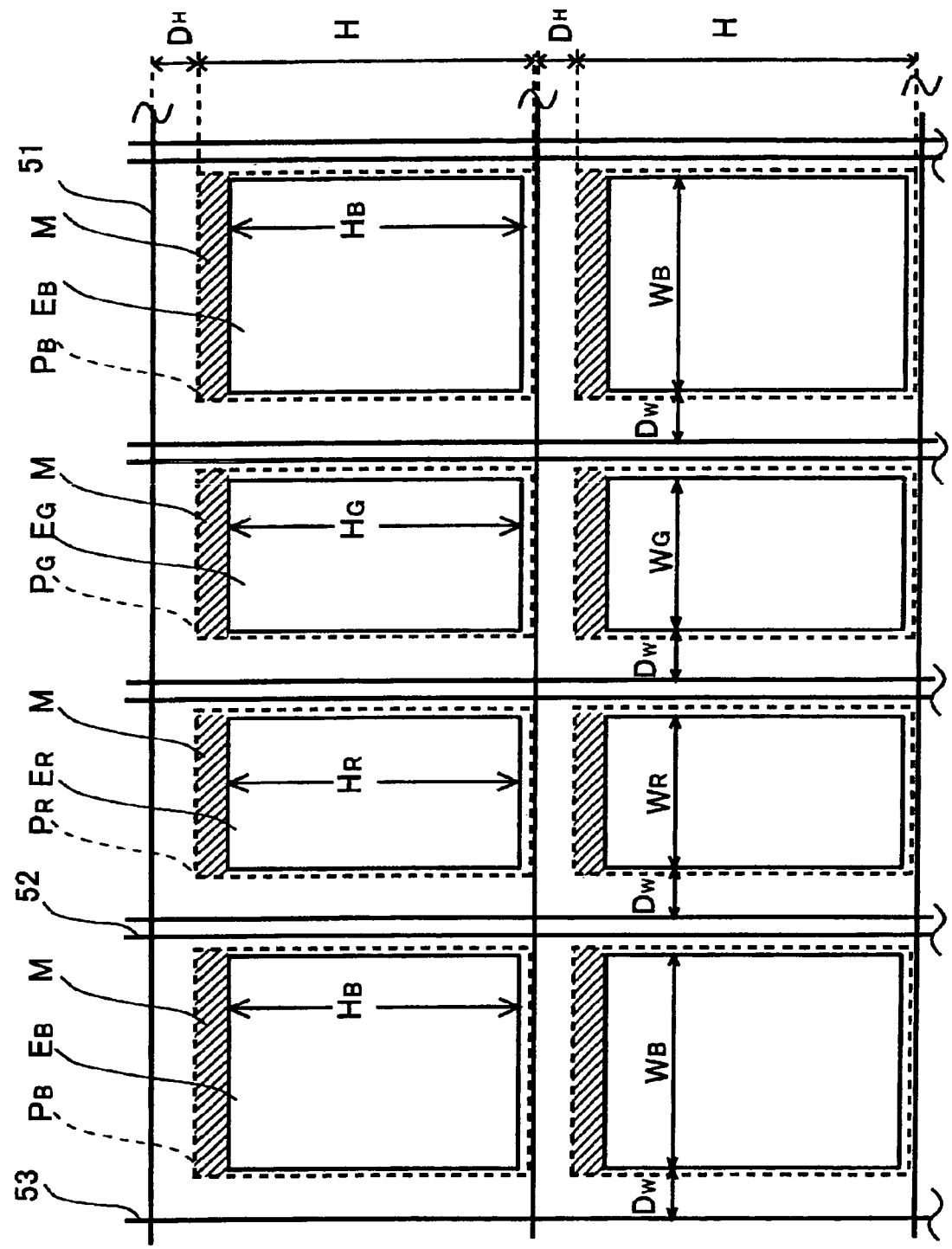
FIG. 9 is a plan view showing light emitting region of an EL display device in a third embodiment of the present invention.

FIG. 9 is a plan view showing a light emitting region of an EL display device in a third embodiment of the present invention, in which the regions are arranged in a stripe, similar to FIG. 1. In this example, the service lives of the light emissive materials for the respective color components have relationship G>R>>B. In this embodiment, a difference in a service life is the smallest between green G and red R.

The shown pixel regions $P_R$, $P_G$, $P_B$ have identical heights (a vertical length) H and different widths (a horizontal length) $W_R$, $W_G(=W_R)$, $W_B$ which are unique to the respective colors. The widths of the regions R and G with the smallest difference in service life are identical.

Meanwhile, the light emitting regions $E_R$, $E_G$, $E_B$ for the respective color emissions have different heights $H_R$, $H_G$, $H_B$ which are unique to the respective color components and lower than the heights H of the pixel regions $P_R$, $P_G$, $P_B$, and widths $W_R$, $W_G(=W_R)$, $W_B$ which are identical to those of the corresponding pixel regions. It should be noted that the difference of a service life between the materials for the regions R and G is set by adjusting the respective heights $H_R$ and $H_G$. As a result of the above arrangement, margins $M_R$, $M_G$, $M_B$ (hatched in the drawing) are ensured along one side of each pixel region $P_R$, $P_G$, $P_B$.

Alternatively, the heights $H_R$, $H_G$, $H_B$ of the respective light emitting regions may be equal to the heights H of the corresponding pixel regions, while the widths $W_R$, $W_G$, $W_B$ thereof may be shorter than the widths of the pixel regions and be unique $W_R'$, $W_G'$, $W_B'$ Along the periphery of the above-structured plurality of pixel regions P, a plurality of gate signal lines 51 are provided in the horizontal direction, and a plurality of drain signal lines 52 and a plurality of driving power source lines 53 are provided in the vertical direction. A distance $D_H$ between a gate signal line 51 and a pixel region and a distance $D_W$ between a driving power source line 53 and a pixel region are set respectively constant, regardless of the width $W_R$, $W_G$, $W_B$ of the pixel regions $P_R$, $P_G$, $P_B$.

This layout leaves no wasteful space in a pixel region and can provide the margin necessary when changing the area of a light emitting region. Moreover, because the widths of respective pixel regions correlated to two color components are identical to each other, layout can be simplified.

A pattern layout method in this embodiment is applied as described with reference to FIG. 2, except that, at step S2, the widths of light emitting regions which are correlated to color components having a small difference in a luminance ratio are set equal to each other and that, at step S4, the heights of the respective light emitting regions $H_R$, $H_G$, $H_B$ are set different from one another.

Specifically, at step S1, luminance of each light emissive material is measured.

At step S2, the widths $W_R$, $W_G$, $W_B$ of the pixel regions $P_R$, $P_G$, $P_B$ are determined. Initially, a ratio between the luminance $L_0$ measured at step S1 and the ideal luminance $L_I$, or $L_I/L_0$ (i.e., luminance ratio), is obtained for each color component. The widths of respective pixel regions correlated to two color components having the smallest difference in a luminance ratio are set equal, and the width of a pixel region correlated to another color component is set according to either one or average of the luminance ratios of the two selected color components.

In an example wherein the ratio among the luminous ratios of the respective colors is R:G:B=1.2:1:3 with red R and green G having the smallest difference in a luminance ratio, the widths $W_R$ and $W_G$ are set equal to each other, and the width $W_B$ is set according to one or average of the luminance ratios of red R and green G. Therefore, the widths $W_R$, $W_G$, $W_B$ may be determined as $W_R:W_G:W_B=1.2:1.2:3$ when the width $W_B$ is determined according to the luminance ratio of red R, or as $W_R:W_G:W_B=1.1:1.1:3$ when the width $W_B$ is determined according to the average of the luminance ratios of red R and green G.

At step S3, the heights H of the pixel regions P are set identical to one another. The height H is slightly higher, or longer, than the expected height of a light emitting region E correlated to one color component so that a space for a margin M can be ensured.

At step S4, light emitting regions $E_R$, $E_G$, $E_B$ are set. Specifically, the widths of the light emitting regions E are set equal to the widths $W_R$, $W_G$, $W_B$ of their corresponding pixel regions P, while the heights thereof are determined such that the ratio of the areas of the respective light emitting regions correlated to the respective color components is in accordance with the ratio among the luminance ratios of the respective color components.

Because the widths $W_R$, $W_G$, $W_B$ of the respective pixel regions P are not strictly set in accordance with the ratio among the luminance ratios of the respective colors at step S2, in most cases, the heights $H_R$, $H_G$, $H_B$ of the light emitting regions E corresponding to the respective color components differ from one another. In other words, because the widths of the respective pixel regions P correlated to two color components and having the smallest difference in a luminance ratio are set identical to each other, the heights of the respective light emitting regions E resultantly differ from one another by an amount corresponding to that difference in the luminance ratio.

This difference, however, is relatively small because the difference in a luminance ratio between the two selected color components is small, and the height of the light emitting region correlated to the not-selected color component is actually substantially equal to that of the two selected color components because the widths of the respective light emitting regions substantially, although not necessarily with a high degree of accuracy, fulfill the ratio among the luminance ratios of the respective colors. In an example wherein the ratio among the luminance ratios of the respective colors, referred to at step S2, is R:G:B=1.2:1:3 and, therefore, the widths are set as $W_R:W_G:W_B=1.2:1.2:3$, the heights of the respective light emitting regions E must be set as $H_R:H_G:H_B=1.2/1.2:1/1.2:1=1.2:1:1.2$.

At step S5, a trial or simulation or the like is attempted using the values set as above to check for any problem with the resultant display.

Through the above processing, pixel regions and light emitting regions for the respective color components can be set according to the luminance halved periods of the respective light emissive materials. According to this method, when the widths of light emitting regions made of light emissive materials having close, that is, only a slightly different, characteristics are set identical, the slight difference in the characteristics can be obviated by finely adjusting the heights of the light emitting regions.

It should be noted that a pixel region can be most efficiently utilized when the height of a light emitting region having the highest height among the light emitting regions correlated to the respective color components is set equal to the height of the pixel region.

Although a margin M is provided above a light emitting region in this embodiment, a margin M may be provided below or right or left to a light emitting region E. When a margin M is provided right or left to a light emitting region E, the width of the light emitting region E may be altered to thereby accommodate the material change. In this case, while the height is kept fixed, the width of the light emitting region E is altered.

Figure 10:
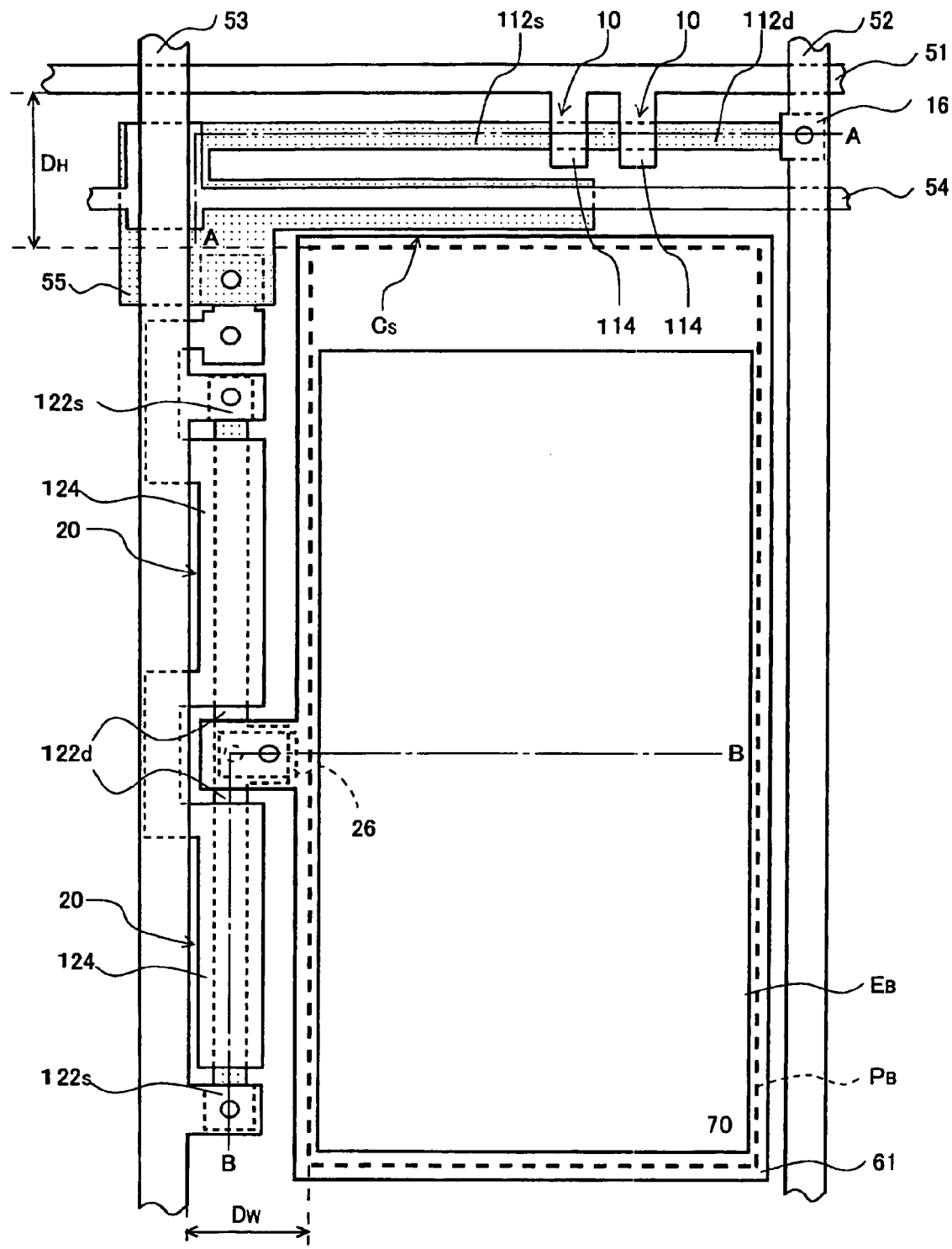
FIG. 10 is a plan view showing the periphery of a pixel region of an EL display device in the second embodiment of the present invention.
Figure 11A:
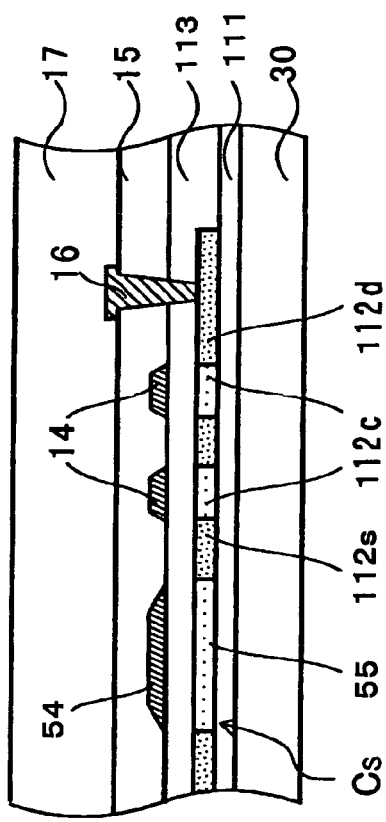
FIGS. 11A and 11B are cross sectional views of an EL display device in the third embodiment of the present invention.
Figure 11B:
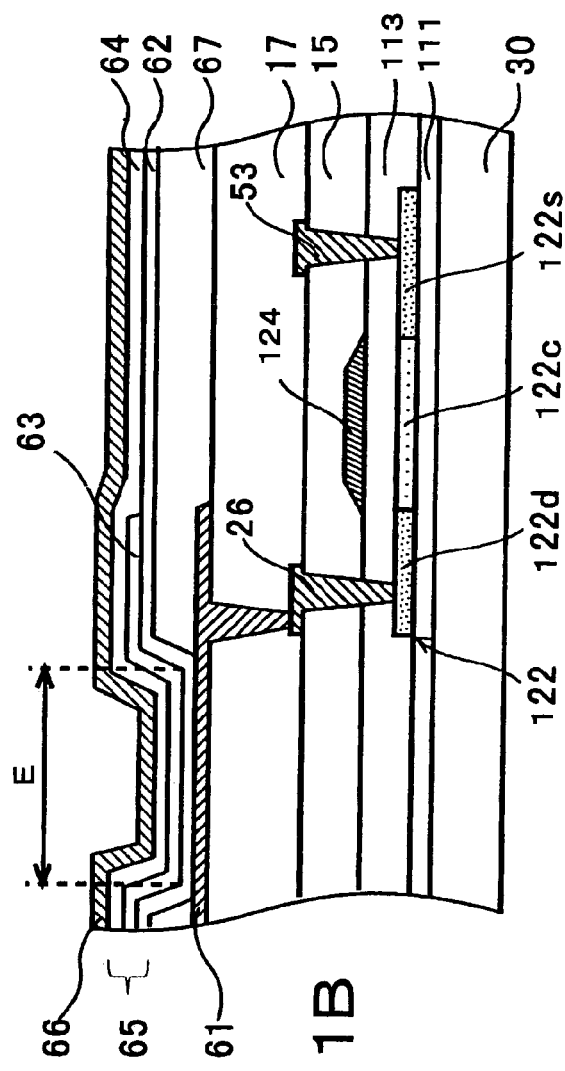

FIG. 10 is a plan view showing a structure of the periphery of a pixel region $P_B$ in this embodiment. FIGS. 11A and 11B are cross sectional views along the segments A—A and B—B, respectively, in FIG. 10. In the following, the structure of a pixel region P according to this embodiment and the periphery of that pixel region P will be described with reference to FIG. 10.

A light emitting region $E_B$ is provided within a pixel region $P_B$, leaving a margin M in an upper (in view of the drawing) portion within the pixel region $P_B$. Two serially connected first TFTs 10, a holding capacitance electrode line 54, and a part of a holding capacitance electrode 55 are provided in a space between the pixel region $P_B$ and the gate electrode 51. The gates 114 of the two TFTs 10 are connected to the gate signal line 51. The drain 112d of the TFTs 10, located closer to a drain signal line 52, is connected to the drain signal line 52, while the source 112s thereof is connected to the holding capacitance electrode 55, which forms a capacitance $C_s$ between itself and the holding capacitance electrode line 54. The source 112s of the TFTs 10 is further connected to the gate electrode 124 of two parallel connected second TFTs 20. The sources 122s of the two TFTs 20 are connected to a driving power source line 53, while the drains 122d thereof are connected to a drain electrode 26 and further to an electrode 61 of the organic EL element 70 via the drain electrode 26.

The holding capacitance electrode line 54 opposes, via the gate insulating film 113, the holding capacitance electrode 55, which is connected to the source 112s of the TFT 10, so that electric charges are accumulated between the holding capacitance electrode line 54 and the capacitance electrode 55 thereby forming a capacitance. The capacitance serves as a holding capacitance $C_s$ for holding a voltage to be applied to the gate electrode 124 of the second TFT 20. It should be noted that the source 112s, the channel 112c, and the drain 112d of the TFTs 10 and the capacitance electrode 55 are a part of a poly-silicon active layer 112 and doped with impurities except for a region below the gate electrode 124 and the capacitance electrode line 54.

In the following, a structure of a first TFT 10 and a holding capacitance $C_s$ connected to the source of the first TFT 10 will be described with reference to FIG. 11A. The TFT 10 is a top-gate TFT for switching. Specifically, on a substrate 10, an insulating film 111 made of, for example, SiN or $SiO_2$ and an active layer 112 made of a polycrystalline silicon (hereinafter abbreviated as p-Si) are formed in that order. The active layer 112 is connected to a holding capacitance electrode 55 similarly made of p-Si. In the active layer 112, a drain 112*d*, a source 112*s*, and a channel 112*c* are formed, in which the channel 112*c* is located between the other two.

Covering the active layer 112 and the holding capacitance electrode 55, a gate insulating film 113 made of a $SiO_2$ or a SiN is formed. Still further, an electrode 114 and a holding capacitance electrode line 54, both made of a metal, such as chrome (Cr) or molybdenum (Mo), having a high melting point, are formed. It should be noted that the gate electrode 114 is formed across the channel 112*c*, and the holding capacitance electrode line 54 is formed opposing to the holding capacitance electrode 55. With the above, a first TFT 10 is constructed.

Covering the entire surface of the gate electrode 114 and the gate insulating film 113, an interlayer insulating film 15 made of an $SiO_2$ film, an SiN film, or the like is formed. On a position corresponding to the drain 112*d*, a contact hole is formed piercing through the interlayer insulating film 15. A drain electrode 16 made of a material such as Al is formed in the contact hole. A planarization film 17 made of organic resin is formed covering the entire surface of the substrate to provide a flat surface.

Next, a structure of a TFT 20 will be described with reference to FIG. 11B. The TFT 20 is a top-gate TFT for driving an organic EL element. On a substrate 10, an insulating film 111 made of, for example, SiN, $SiO_2$, or the like, and an active layer 112 made of a p-Si film are formed in this order. In the active layer 122, a drain 122*d*, a source 122*s*, and a channel 122*c* are formed, such that the channel 122*c* is positioned between the drain 122*d* and source 122*s*.

Covering the entire surface of the active layer 122, a gate insulating film 113 made of an $SiO_2$ and SiN is formed. A gate electrode 124, made of metal, such as chrome (Cr) or molybdenum (Mo), having a high melting point, is formed across the channel 122*c*, thereby completing construction of a second TFT 20.

Covering the entire surface of the gate electrode 124 and the gate insulating film 113, an interlayer insulating film 15 made of an $SiO_2$ film, an SiN film, or the like is formed. On positions corresponding to the source 122*s* and the drain 122*d*, contact holes are formed piercing through the interlayer insulating film 15. A metal drain electrode 26 and a driving power source line 53 connected to a driving power source are formed in the respective contact holes. A planarization film 17 made of organic resin is formed covering the entire surface of the substrate to provide a flat surface.

An electrode 61, made of ITO (Indium Tin Oxide), connected to the drain electrode 26 is formed on and in, or piercing through, the planarization film 17 to be connected to the drain electrode 26. A light emitting layer 65, which comprises three layers including a hole transfer layer 62, a light emitting layer 63, and an electron transfer layer 64, is formed on the electrode 61. A electrode 66 made of aluminum alloy or the like is formed covering the light emitting element layer 65.

In the above structure, a second planarization film 67 made of electric insulating resin is formed between the hole transfer layer 62 and the electrode 61. The second planarization film 67 has an opening in a region corresponding to the electrode 61. The opening defines a region through which the electrode 61 is exposed. That is, a light emitting region E is defined by the opening of the second planarization film 67. Note that a pixel region P in this structure is defined by the electrode 61.

Figure 12A:
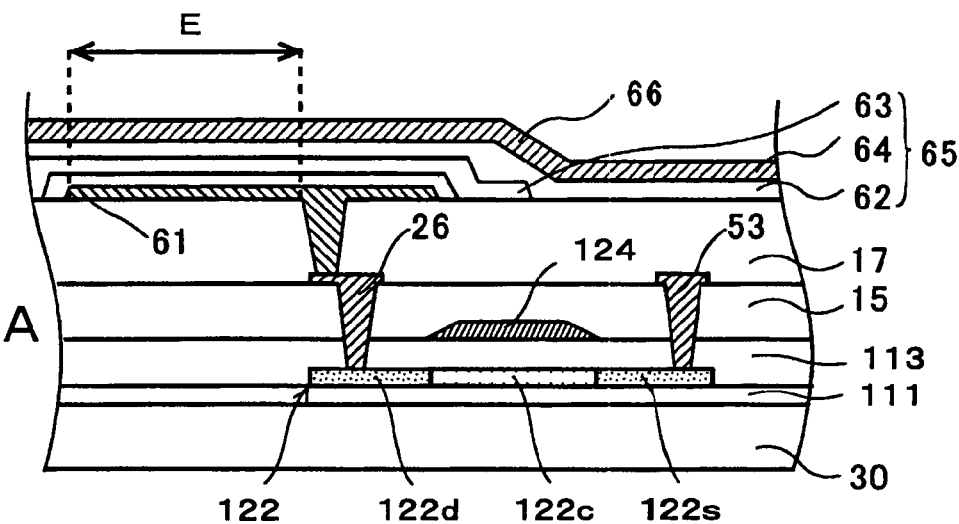
FIGS. 12A and 12B are cross sectional views of a second TFT of an EL display device in the third embodiment of the present invention.

Beside the method described above, which is a method of the first type and utilizes the second planarization film 67 in formation of a light emitting region E having a predetermined shape, a method of the second type may be employed. Such a second method utilizes the shape of the electrode 61 of an organic EL element, as shown in FIG. 12A, rather than the second planarization film 67. In this method, a light emitting region E is defined by the electrode 61, while pixel region P is defined by the light emitting layer 63.

Figure 12B:
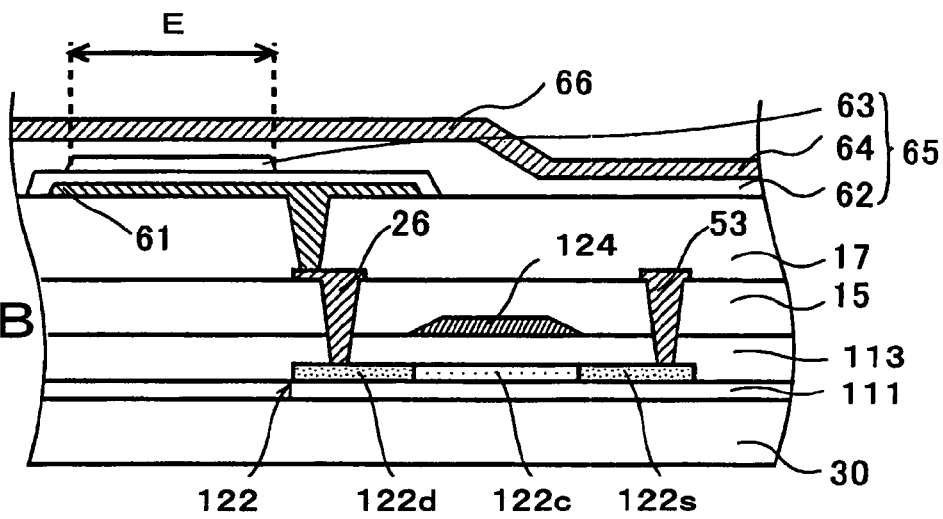

Besides the above two methods, a third method utilizing the light emitting layer 63, as shown in FIG. 12B, may be employed. In this method, a light emitting region E is defined by the light emitting layer 63, while a pixel region P is defined by the electrode 61.

FIGS. 13A to 13D are cross sectional views explaining respective stages in manufacturing of an EL display device in this embodiment. These views correspond to a cross sectional view along the segment B—B in FIG. 10. In the following, manufacturing of an EL display device using the first method will be described.

Figure 13A:
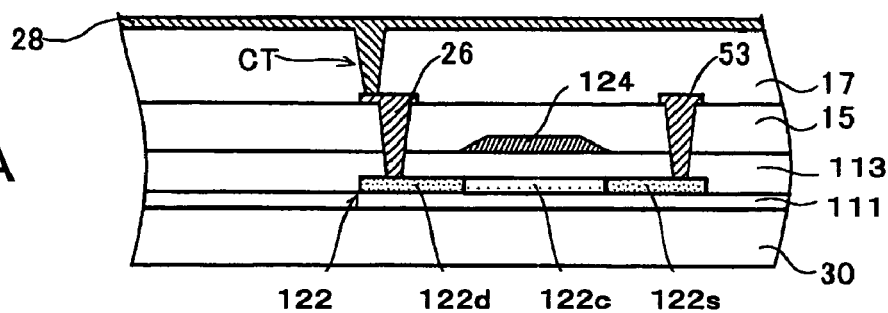
FIGS. 13A, 13B, 13C and 13D are cross sectional views showing respective stages in manufacturing of an EL display device in the third embodiment of the present invention.

FIG. 13A is a cross sectional view showing a first stage of the manufacturing process. At this stage, after formation of the second TFT 20 using a conventional method, an interlayer insulating film 15 is formed so as to cover the TFT 20. Then, the driving power source line 53 connected to the source 122*s* of the TFT 20 and the drain electrode 26 connected to the drain 122*d* of the TFT 20 are formed, and the planarization film 17 is formed over them. A contact hole CT is formed which pierces through the planarization film 17 and reaches the drain electrode 26. An ITO 28, or a transparent anode material, is sputtered on the entire surface of the planarization film 17 and in the contact hole CT.

Figure 13B:
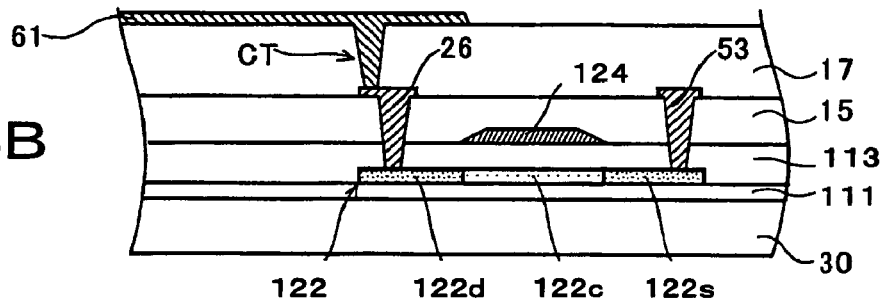

FIG. 13B is a cross sectional view showing a second stage of the manufacturing process. At this stage, a resist is formed on the ITO 28. Thereafter, the resist is exposed to light using a mask and then developed for patterning. Then, using the resist as a mask, the ITO 28 is etched to thereby form an electrode 61.

Figure 13C:
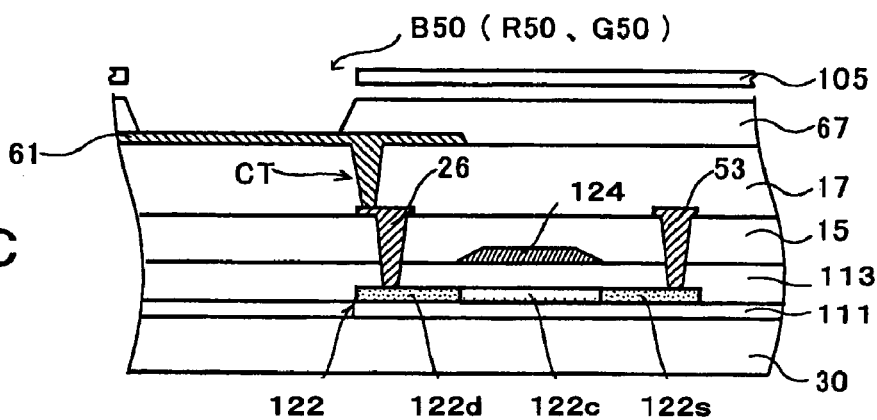
Figure 14:
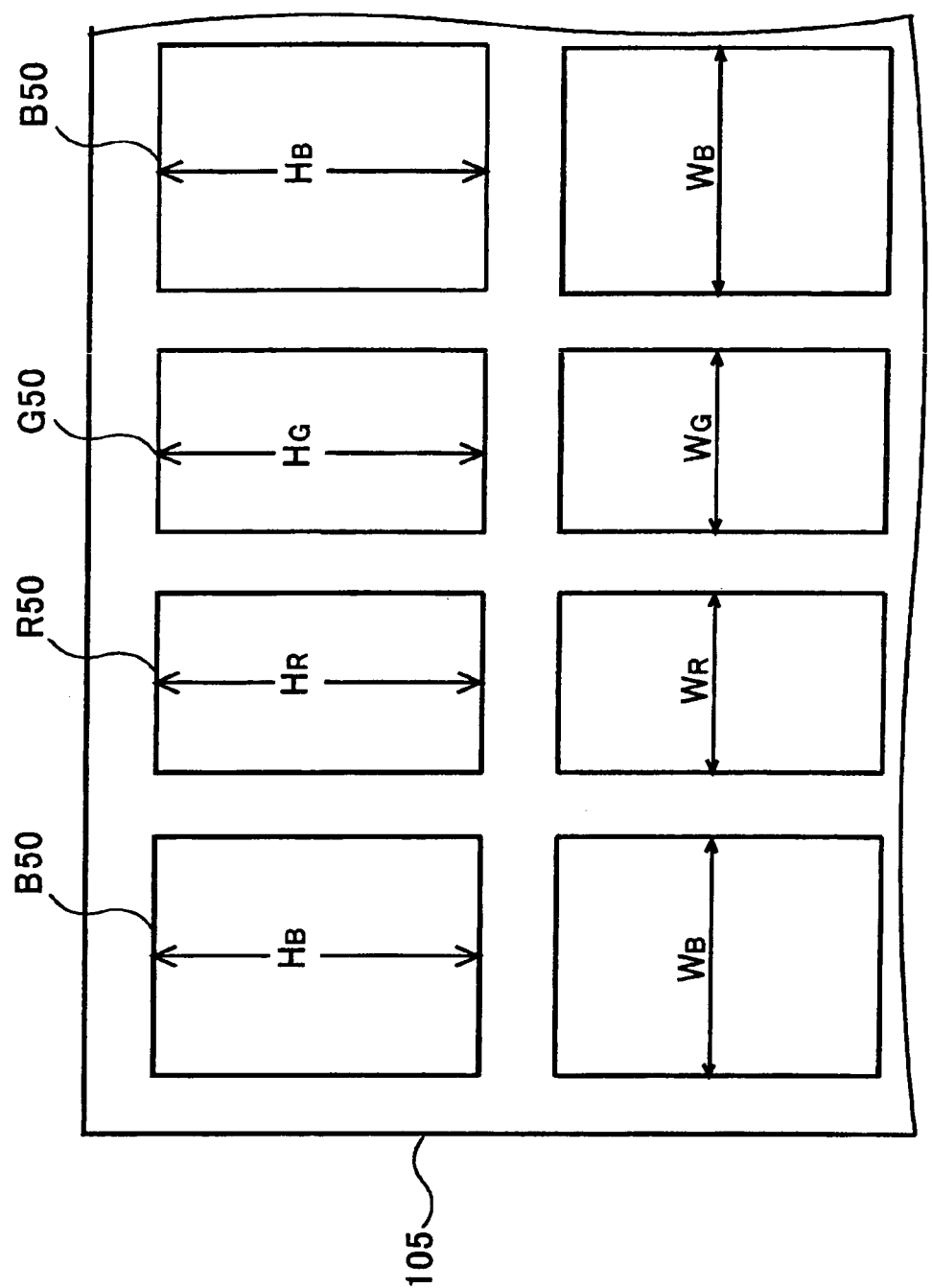
FIG. 14 is a mask for use in formation of an anode electrode of an EL display device in the third embodiment of the present invention.

FIG. 13C is a cross sectional view showing a third stage of the manufacturing process. At this stage, a second planarization film material which is an organic resin is formed by spin-coating or the like on the electrode 61 and the planarization film 17. The second planarization film material is exposed to light using a mask 105 and developed to thereby form a second planarization film 67. The mask 105 has a plurality of openings R50, G50, and B50, as shown in FIG. 14, for example, and the openings R50, G50, and B50 have predetermined widths $W_R$, $W_G$, $W_B$ and heights $H_R$, $H_G$, $H_B$, respectively. Therefore, the resultant second planarization film 67 has an opening having a shape identical to that of a light emitting region E and formed in a position corresponding to the light emitting region E. The electrode 61 is exposed through the opening.

Figure 13D:
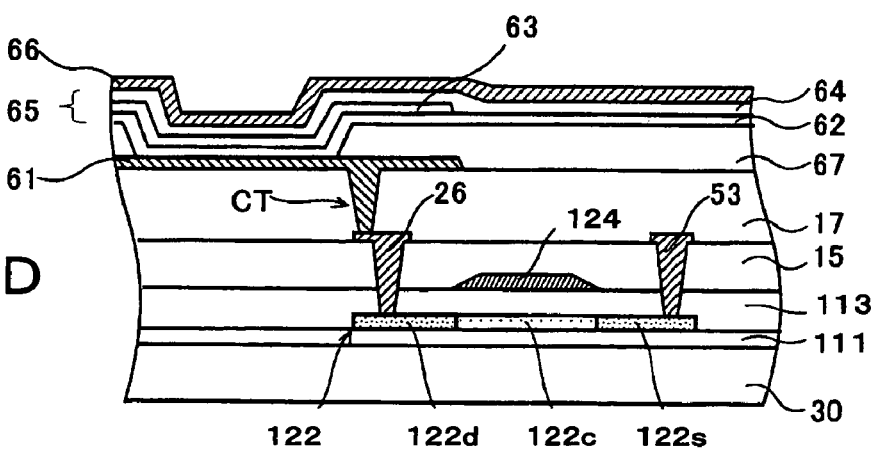

FIG. 13D is a cross sectional view showing a fourth stage of the manufacturing process. At this stage, a hole transfer layer 62 is formed through evaporation on the second planarization film 67 so as to cover the entire substrate including the exposed electrode 61. A light emitting layer 63 is formed through evaporation using a different mask for a different kind of light emissive material. Subsequently, an electron transfer layer 64 is formed through evaporation on the entire surface of the substrate. The hole transfer layer 62, the light emitting layer 63, and the electron transfer layer 64 together constitute a light emitting element layer 65. An electrode 66 is formed through evaporation using a mask over a light emitting element layer 65.

It should be noted that, because the resistance of these light emissive materials is relatively high, the light emitting element layer 65 between the electrode 61 and the electrode 66 serves as a light emitting region. Although the hole transfer layer 62 and the electron transfer layer 64 are formed over the entire surface of the substrate in the above, a different kind of electron transfer layer material may be used for a different kind of light emitting material.

Through the above process, a color display device employing an organic EL element having a desired light emitting region for each color is constituted.

Next, the second method for defining a light emitting region E having a predetermined shape will be described, in which an electrode 61 is utilized to define a light emitting region E. This method is achievable through substantially identical processing stages as those of the first method, except that the second planarization film 67 is not formed. Instead, an electrode 61 having an identical shape to that of a light emitting region is formed using a mask in a region where the light emitting region is to be formed, and a light emitting element layer 65 and an electrode 66 are formed so as to cover the electrode 61. This method results in an EL display device having a cross sectional structure as shown in FIG. 12A. A mask for use in formation of the electrode 61 may have openings, similar to the mask of FIG. 14, each having a shape identical to that of a light emitting region E and formed in a position corresponding to the light emitting region E.

The third method for defining a light emitting region E having a predetermined shape, in which a light emitting layer 63 is utilized to define a light emitting region E, will be described. This method is achievable through substantially identical processing stages as those of the second method described above, except that a larger electrode 61 than a light emitting region is formed and a light emitting layer 63 having an identical shape to that of a light emitting region E is formed using a mask in a region where the light emitting region E is to be formed. This method results in an EL display device having a cross sectional structure as is shown in FIG. 12B. Note that a mask for use in formation of the light emitting layer 63 may have openings, similar to the mask of FIG. 14, each having a shape identical to that of a light emitting region E and for med in a position corresponding to the light emitting region E. For this method, a same number of masks as the number of different color components are necessary because a different kind of light emissive material is used for a different color component. Each mask has an opening corresponding to a light emitting region E correlated to one color component.

As described above, in this embodiment, because a light emitting region E is provided together with a margin M within a light emitting region, the height of the light emitting region having been already laid out can be altered within the range of the pixel region while maintaining the width thereof not altered. This makes it possible to maintain constant white balance even when the materials are changed.

Moreover, in the above, because it is unnecessary to change the size or layout of the region enclosed by the gate signal line 51, the drain signal line 52, and the driving power source line 53, it is sufficient to change only the minimum number of masks, which may be one. For example, for an EL display device having a second planarization film 67, it is the height of the opening formed on a mask 105 which is used to form the second planarization film 67, that must be alters to thereby alter the height of the light emitting region in order to accommodate material change. That is, material change can be accommodated by changing only the one mask which is used in forming the second planarization film 67.

It should be noted that because the electrode 61 is smaller than a pixel region P, though larger than a light emitting region E, the pixel region P may not be defined by the electrode 61. Therefore, should the height of the light emitting region E be altered to become larger than that of the electrode 61, a mask used to form the electrode 61 must be changed in addition to changing a mask used to form the second planarization film 67. That is, two masks must be changed in such a case.

Figure 15:
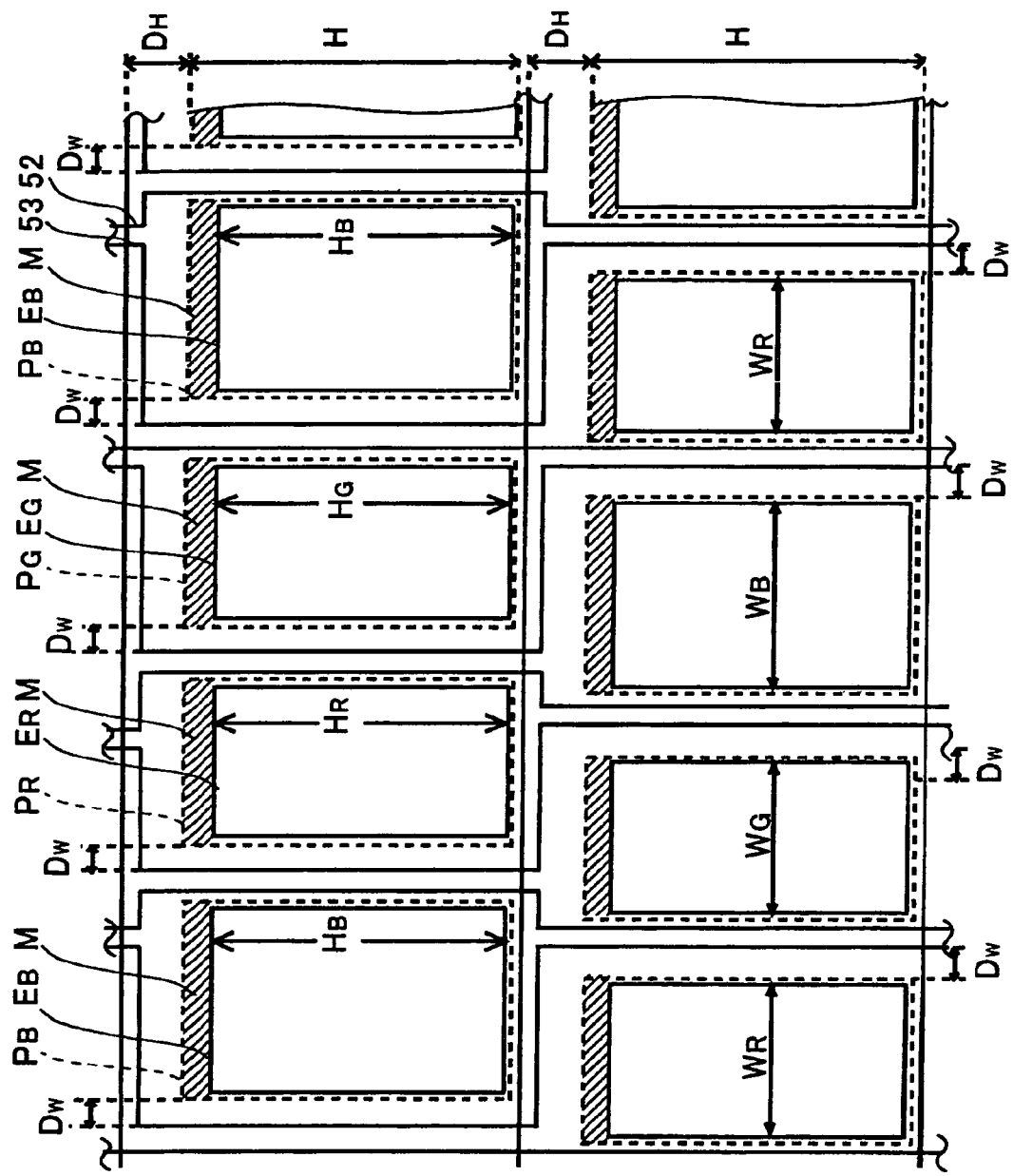
FIG. 15 is a plan view showing a light emitting region of an EL display device in a fourth embodiment of the present invention.
Figure 16:
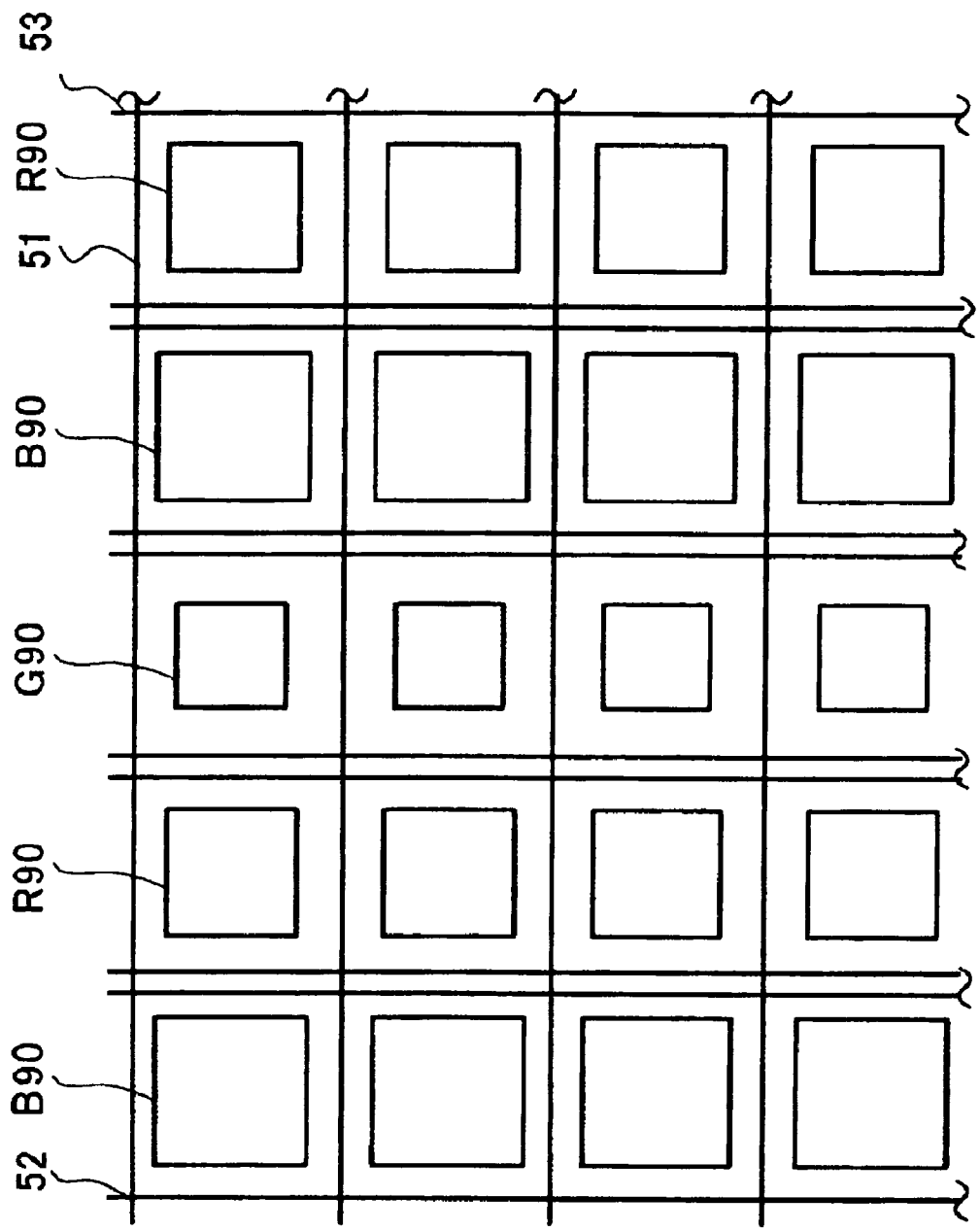
FIG. 16 is a plan view showing a light emitting region of a conventional EL display device.

FIG. 15 shows a light emitting region of an EL display device in a fourth embodiment. In this drawing, pixel regions $P_R$, $P_G$, $P_B$ and light emitting regions $E_R$, $E_G$, $E_B$, as determined similar to the third embodiment, are arranged with displacement by about 1.5 pixel region between an odd-numbered row and an even-numbered row. With this arrangement, any combination of three adjacent pixel regions includes red R, green G, and blue B. This arrangement is referred to as a delta alignment.

In this embodiment, the lengths in one direction of pixel regions correlated to two color components are set identical to each other. This can further facilitate laying out of a TFT substrate of an EL display device. It should be noted that the third and fourth embodiments can also be further modified as described above to produce similar advantages.

What is claimed is:

1. An electroluminescence display device having a plurality of pixel regions aligned according to a predetermined rule, each having a light emitting region, wherein
   the plurality of pixel regions are respectively correlated to particular color components,
   at least a pixel region correlated to one color component among the plurality of color components are formed having a different area from that of a pixel region correlated to another color component, and
   at least a light emitting region correlated to one color component is formed within the pixel region such that a length thereof in a first direction is identical to a corresponding length of the pixel region and that another length thereof in a second direction which intersects the first direction is shorter than a corresponding length of the pixel region.

2. The device according to claim 1, wherein
   the plurality of pixel regions are respectively correlated to one of three colors, and
   an area of the pixel region differs depending on a color to which the pixel region is correlated.

3. The device according to claim 1, wherein
   the plurality of pixel regions correlated to the respective color components are formed such that lengths of the plurality of pixel regions in either the first direction or the second direction are identical.

4. The device according to claim 3, wherein
   a plurality of signal lines are provided along an alignment of a plurality of pixel regions, and
   the plurality of signal lines are provided apart from the plurality of pixel regions by a predetermined distance.

5. The device according to claim 3, wherein
   a plurality of driving power source lines are provided along an alignment of the plurality of pixel regions, and
   the plurality of driving power source lines are provided apart from the plurality of pixel regions by a predetermined distance.

6. The device according to claim 2, wherein
   a length in the first direction of the pixel region is determined according to a change over time of a characteristic of a light emissive material for each color component.

7. An electroluminescence display device having a plurality of pixel regions aligned according to a predetermined rule, each having a light emitting region, arranged according to a predetermined rule, wherein
the plurality of pixel regions are respectively correlated to particular color components,
a pixel region correlated to a first color component and a pixel region correlated to a second color component are formed having an identical area,
a pixel region correlated to a third color component is formed having a different area from the area of the pixel regions respectively correlated to the first color component and to the second color component, and
a light emitting region formed in at least a pixel region correlated to one color component has a length in a first direction which is identical to a corresponding length of the pixel region and a length in a second direction which intersects the first direction, which is shorter than a corresponding length of the pixel region.

8. The device according to claim 7, wherein
the plurality of pixel regions correlated to the respective color components are formed such that lengths of the plurality of pixel regions in either the first direction or the second direction are identical.

9. The device according to claim 8, wherein
a plurality of signal lines are provided along an alignment of a plurality of pixel regions, and
the plurality of signal lines are provided apart from the plurality of pixel regions by a predetermined distance.

10. The device according to claim 8, wherein
a plurality of driving power source lines are provided along an alignment of the plurality of pixel regions, and
the plurality of driving power source lines are provided apart from the plurality of pixel regions by a predetermined distance.

11. The device according to claim 8, wherein
a length in the first direction of the pixel region is determined according to a change over time of a characteristic of a light emissive material for each color component.

* * * * *